US010522587B2

(12) United States Patent
Zeng et al.

(10) Patent No.: US 10,522,587 B2
(45) Date of Patent: Dec. 31, 2019

(54) DISPLAY PANEL AND DISPLAY APPARATUS

(71) Applicant: XIAMEN TIANMA MICRO-ELECTRONICS CO., LTD., Xiamen (CN)

(72) Inventors: Yongping Zeng, Xiamen (CN); Binyi Zheng, Xiamen (CN); Yan Yang, Xiamen (CN); Ling Wu, Xiamen (CN); Boping Shen, Xiamen (CN); Ankai Ling, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 15/972,690

(22) Filed: May 7, 2018

(65) Prior Publication Data
US 2019/0088709 A1 Mar. 21, 2019

(30) Foreign Application Priority Data

Sep. 19, 2017 (CN) .......................... 2017 1 0852909
Jan. 31, 2018 (CN) .......................... 2018 1 0098537

(51) Int. Cl.
H01L 27/12 (2006.01)
H01L 27/15 (2006.01)
G09G 3/20 (2006.01)
(52) U.S. Cl.
CPC ........ H01L 27/156 (2013.01); H01L 27/1218 (2013.01); G09G 3/2074 (2013.01); G09G 2300/0452 (2013.01)

(58) Field of Classification Search
CPC ... H01L 27/1218; H01L 27/156; H01L 27/32; H01L 27/3218; G09G 2300/0452; G09G 2300/2074; G09G 3/2074
See application file for complete search history.

(56) References Cited

U.S. PATENT DOCUMENTS

2016/0120005 A1* 4/2016 Wu ........................ H05B 33/26
313/505
2016/0211308 A1* 7/2016 Lee .......................... G09G 3/32
2017/0219895 A1* 8/2017 Yu ........................ G02F 1/13454
2017/0322446 A1* 11/2017 Tae .................... G02F 1/133345

* cited by examiner

Primary Examiner — Caridad Everhart
(74) Attorney, Agent, or Firm — Anova Law Group PLLC

(57) ABSTRACT

A display panel comprises a display region, a non-display region, and a black matrix. The display region includes a plurality of pixels arranged in both a first direction and a second direction, where the plurality of pixels are arranged in the first direction to form a plurality of pixel rows and, meanwhile, arranged in the second direction to form a plurality of pixel columns, and a pixel includes a light-transmitting area. The black matrix does not overlap with the light-transmitting area. The display region includes at least one irregular edge intersecting both the first direction and the second direction. The plurality of pixels include a plurality of first pixels intersecting the at least one irregular edge and a plurality of second pixels without intersecting the at least one irregular edge, and the light-transmitting area of the first pixel is smaller than the light-transmitting area of the second pixel.

25 Claims, 16 Drawing Sheets

US 10,522,587 B2

1

DISPLAY PANEL AND DISPLAY APPARATUS

CROSS-REFERENCES TO RELATED APPLICATIONS

This application claims the priority of Chinese Patent Application No. 201710852909.3, filed on Sep. 19, 2017, and the priority of Chinese Patent Application No. 201810098537.4, filed on Jan. 31, 2018, the entire contents of which are incorporated herein by reference.

FIELD OF THE DISCLOSURE

The present disclosure generally relates to the field of display technology and, more particularly, relates to a display panel and a display apparatus thereof.

BACKGROUND

As the display technology advances, user demands become more and more diversified. Existing rectangular-shaped display panels are unable to satisfy more and more diversified user demands for displays and applications. Thus, non-rectangular display panels are gradually emerging as a trend of display technology.

FIG. 1 illustrates a top view of an existing display panel. FIG. 2 illustrates an enlarged view of an M region in FIG. 1. As shown in FIG. 1, the display panel includes a display region AA and a non-display region BB. In the display region AA, a plurality of pixels 01 are arranged in an array in both a row direction h and a column direction z. A boundary of the display region AA includes an irregular-shaped edge L. The irregular-shaped edge L is a curved line. An extension direction of the irregular-shaped edge L intersects the row direction h and the column direction z. When the display panel displays images, ideally the irregular-shaped edge L of the display region AA should be a smooth curved line.

However, as shown in FIG. 2, because a pixel 01 includes a plurality of rectangular-shaped sub-pixels 011 arranged in the row direction h and the column direction z, the irregular edge of the display region AA is actually a jagged image edge L'. When the display panel displays images, the images may appear jagged at the position of the irregular edge L, thereby degrading the display performance.

The disclosed display panel and display apparatus thereof are directed to solve one or more problems set forth above and other problems.

BRIEF SUMMARY OF THE DISCLOSURE

One aspect of the present disclosure provides a display panel. The display panel includes a display region, a non-display region surrounding the display region, and a black matrix. The display region including a plurality of pixels arranged in both a first direction and a second direction, wherein the plurality of pixels are arranged in the first direction to form a plurality of pixel rows and, meanwhile, arranged in the second direction to form a plurality of pixel columns, and a pixel includes a light-transmitting area. The black matrix does not overlap with the light-transmitting area. The display region includes at least one irregular edge intersecting both the first direction and the second direction. The plurality of pixels include a plurality of first pixels intersecting the at least one irregular edge and a plurality of second pixels without intersecting the at least one irregular edge, and the light-transmitting area of the first pixel is

2 smaller than the light-transmitting area of the second pixel. The plurality of pixels include a plurality of pixel groups, wherein a pixel group includes at least two pixels consecutively arranged in a same pixel row or a same pixel column, when the at least two pixels include one second pixel and one first pixel, the light-transmitting area of the first pixel is smaller than the light-transmitting area of the second pixel, and when the at least two pixels includes one second pixel and more than one first pixel, the light-transmitting area in the first pixel close to the second pixel is greater than or equal to the light-transmitting area in the first pixel far away from the second pixel. The plurality of pixel groups include a plurality of first-type pixel groups and a plurality of second-type pixel groups, and a first-type pixel group includes more first pixels than a second-type pixel group. The light-transmitting areas of the at least two pixels in the first-type pixel group have m number of different sizes, and the light-transmitting areas of the at least two pixels in the second-type pixel group have n number of different sizes, where m≥n.

Another aspect of the present disclosure provides a display apparatus comprising a disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. Other embodiments obtained by those skilled in the art without making creative work are within the scope of the present invention.

The present disclosure provides an improved display panel, which is capable of suppressing jagged image edge at an irregular edge of the display region.

Figure 1:
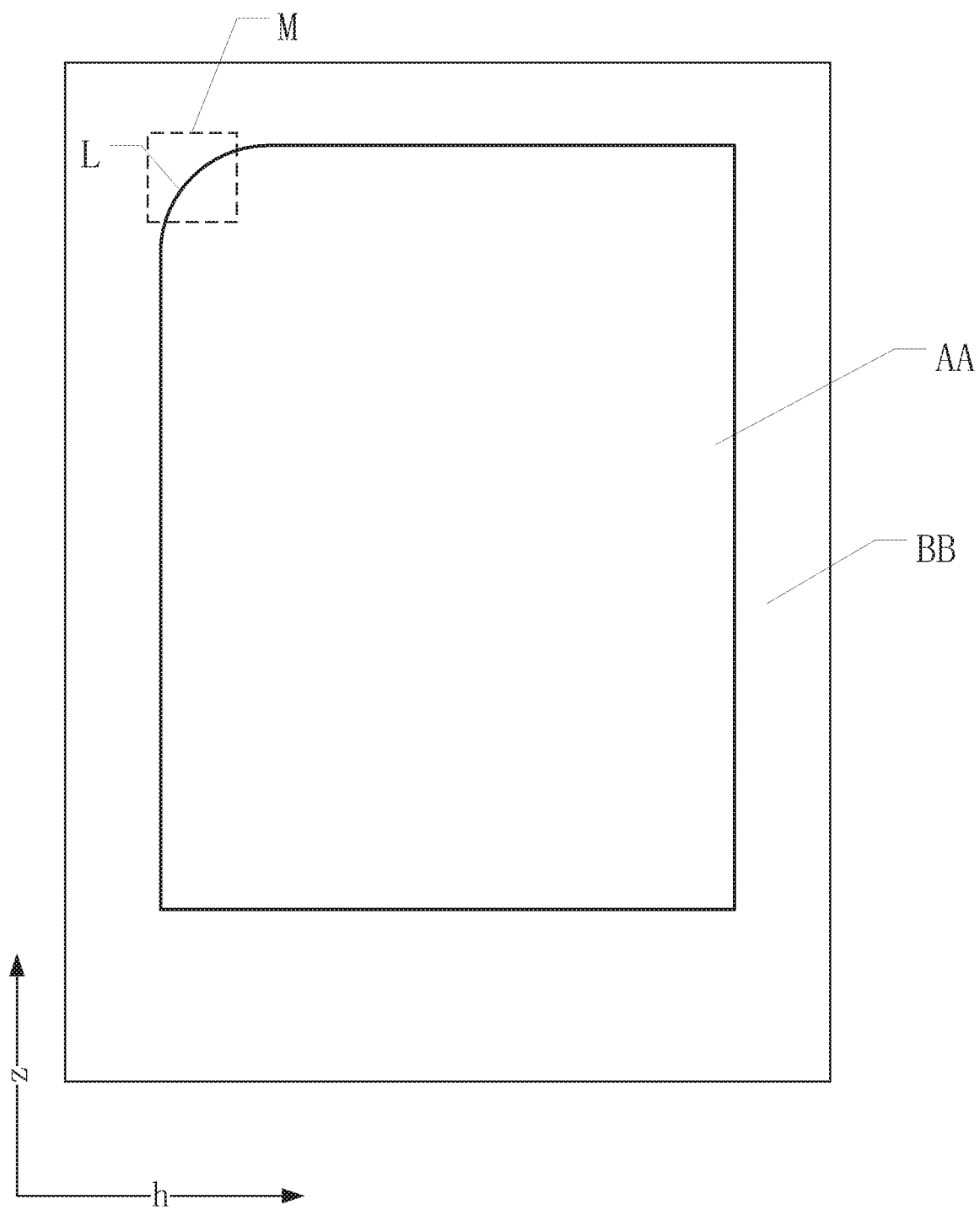
FIG. 1 illustrates a top view of an existing display panel.
Figure 2:
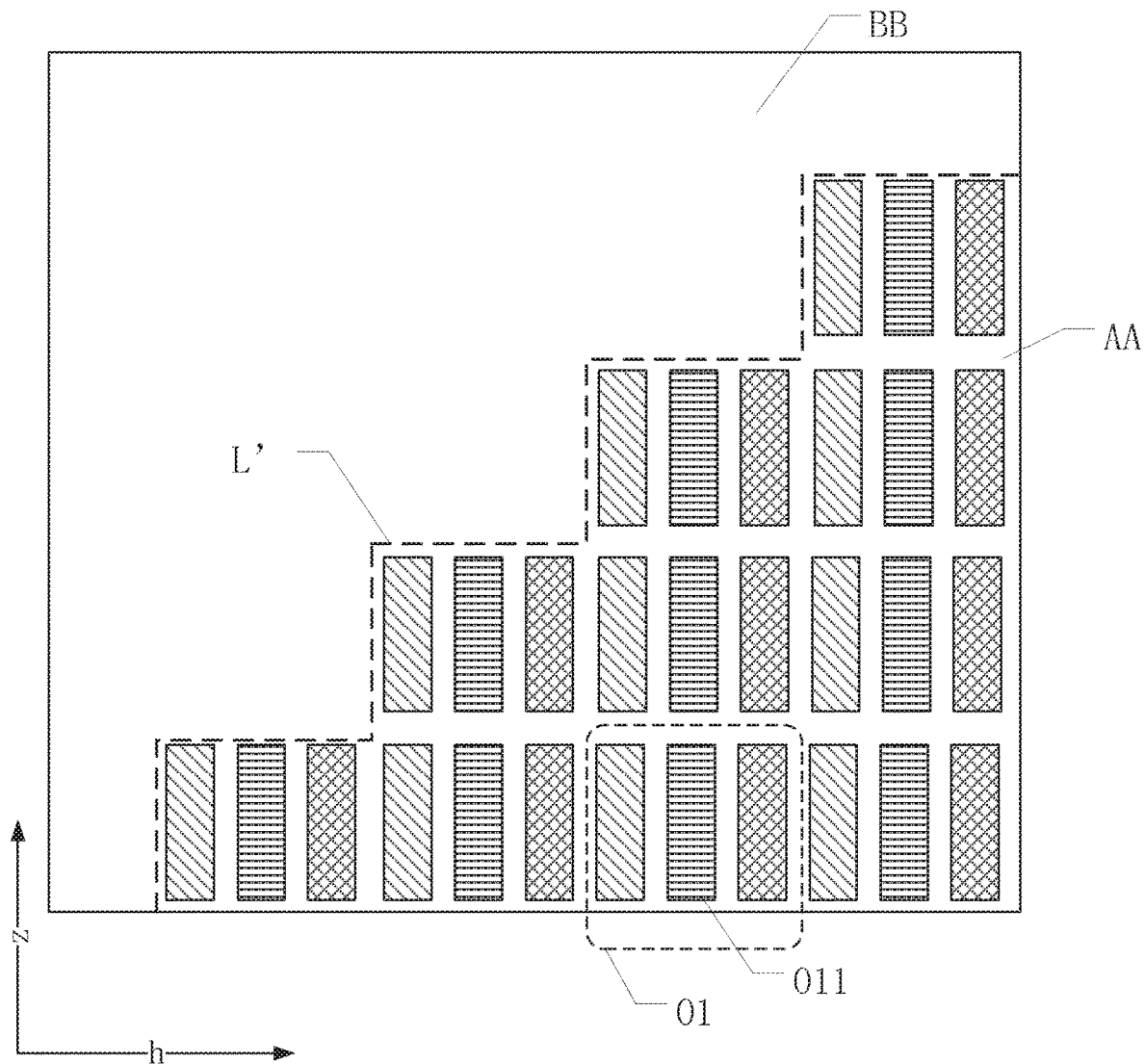
FIG. 2 illustrates a partially enlarged view of an M region in FIG. 1.
Figure 3:
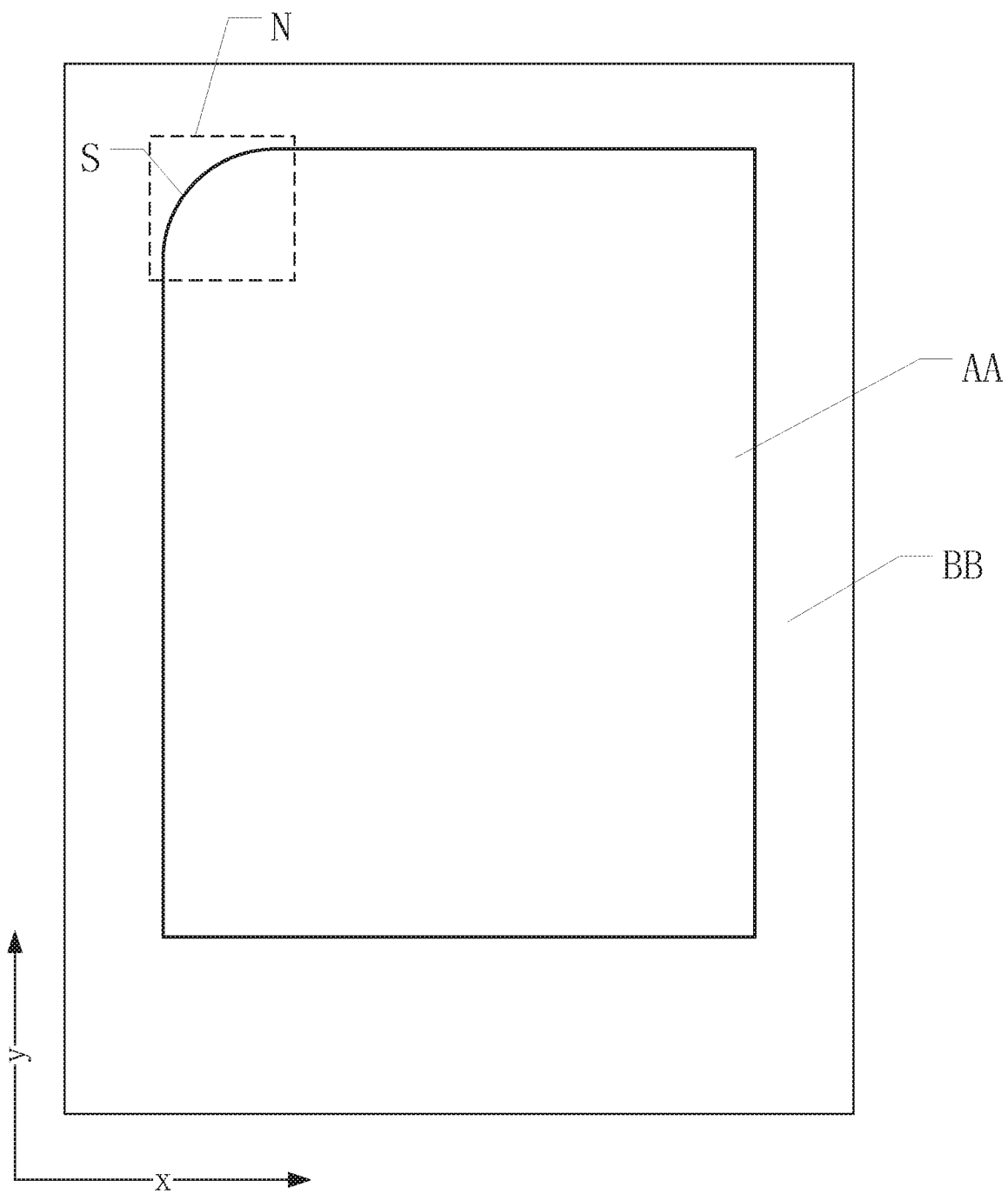
FIG. 3 illustrates a top view of an exemplary display panel according to the disclosed embodiments.
Figure 4:
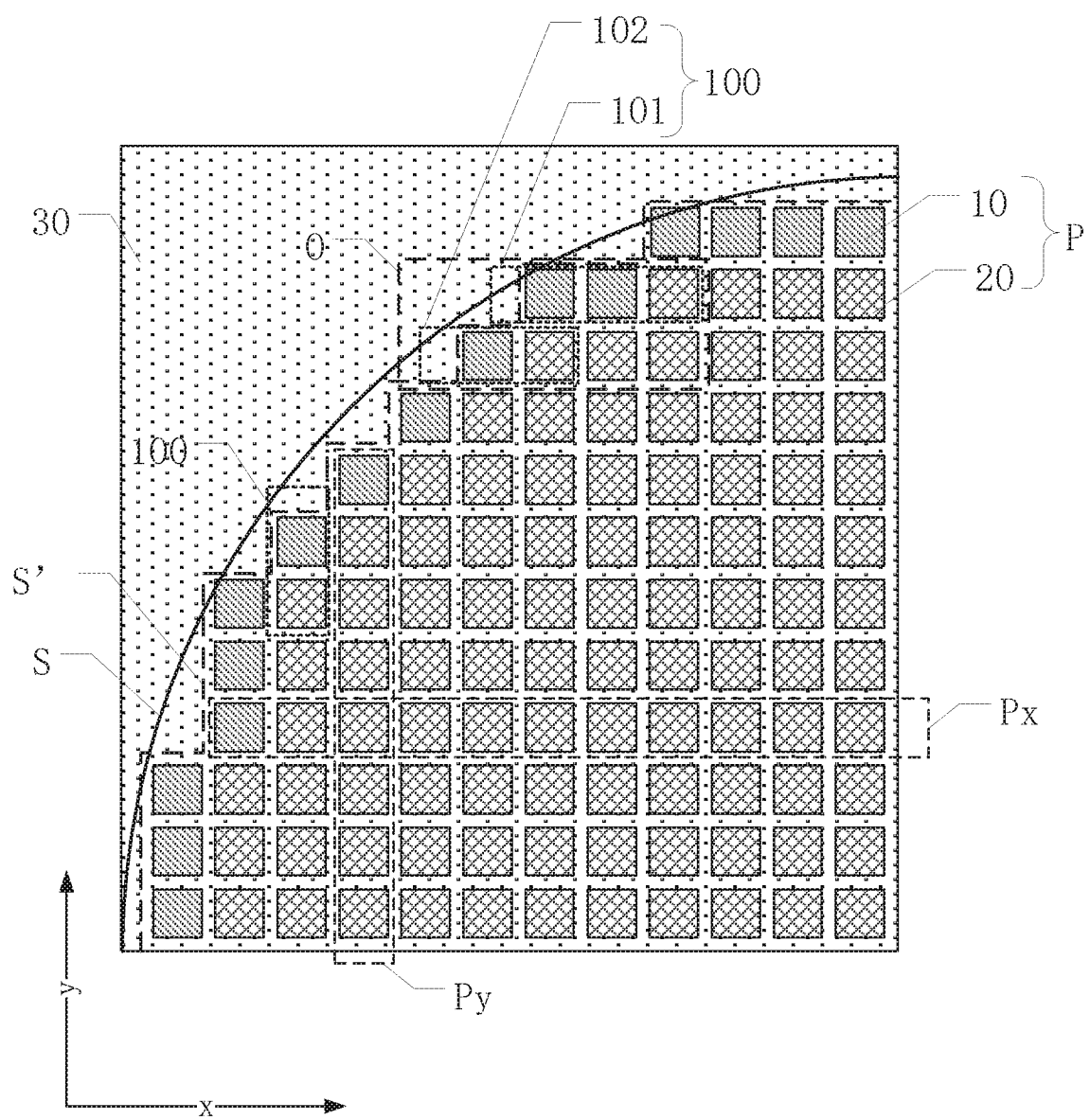
FIG. 4 illustrates an exemplary partially enlarged view of an N region in FIG. 3.

FIG. 3 illustrates a top view of an exemplary display panel according to the disclosed embodiments. FIG. 4 illustrates an exemplary partially enlarged view of an N region in FIG. 3.

As shown in FIGS. 3-4, the display panel may include a display region AA and a non-display region BB surrounding the display region AA. The display region may include a plurality of pixels P. The plurality of the pixels P may be arranged in a first direction x and a second direction y. The pixels P arranged in the first direction x may form pixel rows Px. The pixels P arranged in the second direction y may form pixel columns Py. The display region AA may include a plurality of pixel rows Px and a plurality of pixel columns Py. The first direction x intersects the second direction y. In one embodiment, as shown in FIGS. 3-4, the first direction x may be perpendicular to the second direction y.

Figure 5:
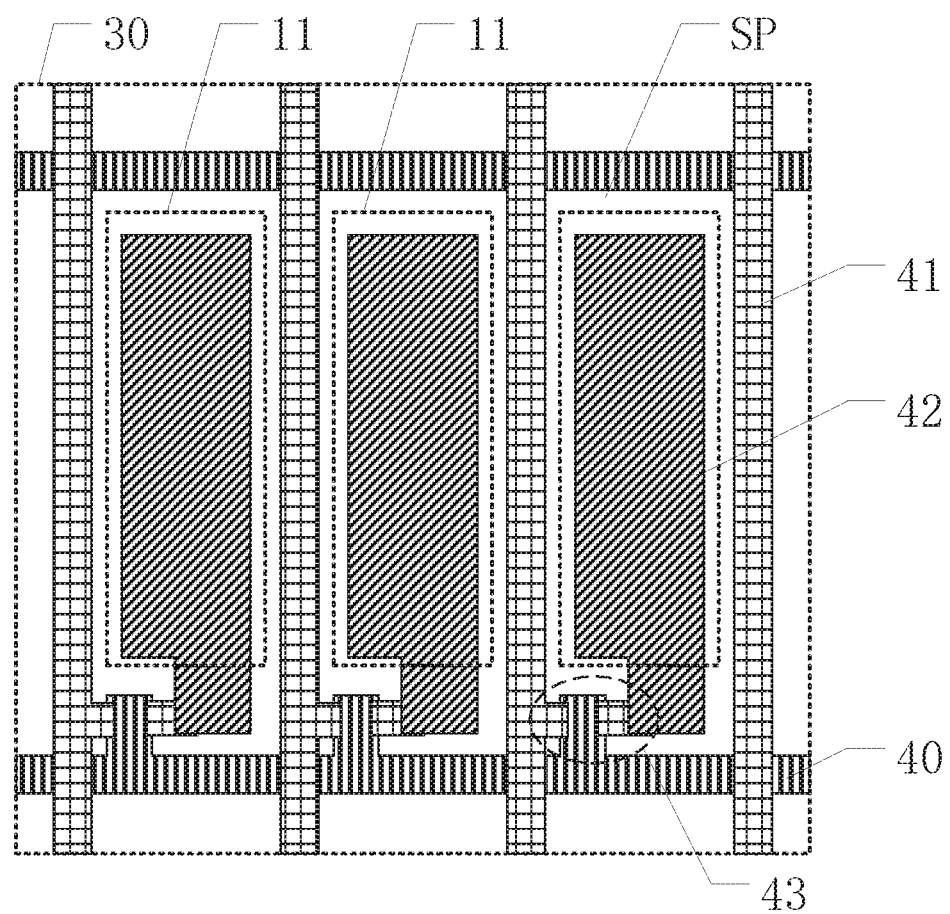
FIG. 5 illustrates a schematic view of an exemplary pixel in an exemplary display panel according to the disclosed embodiments.
Figure 6:
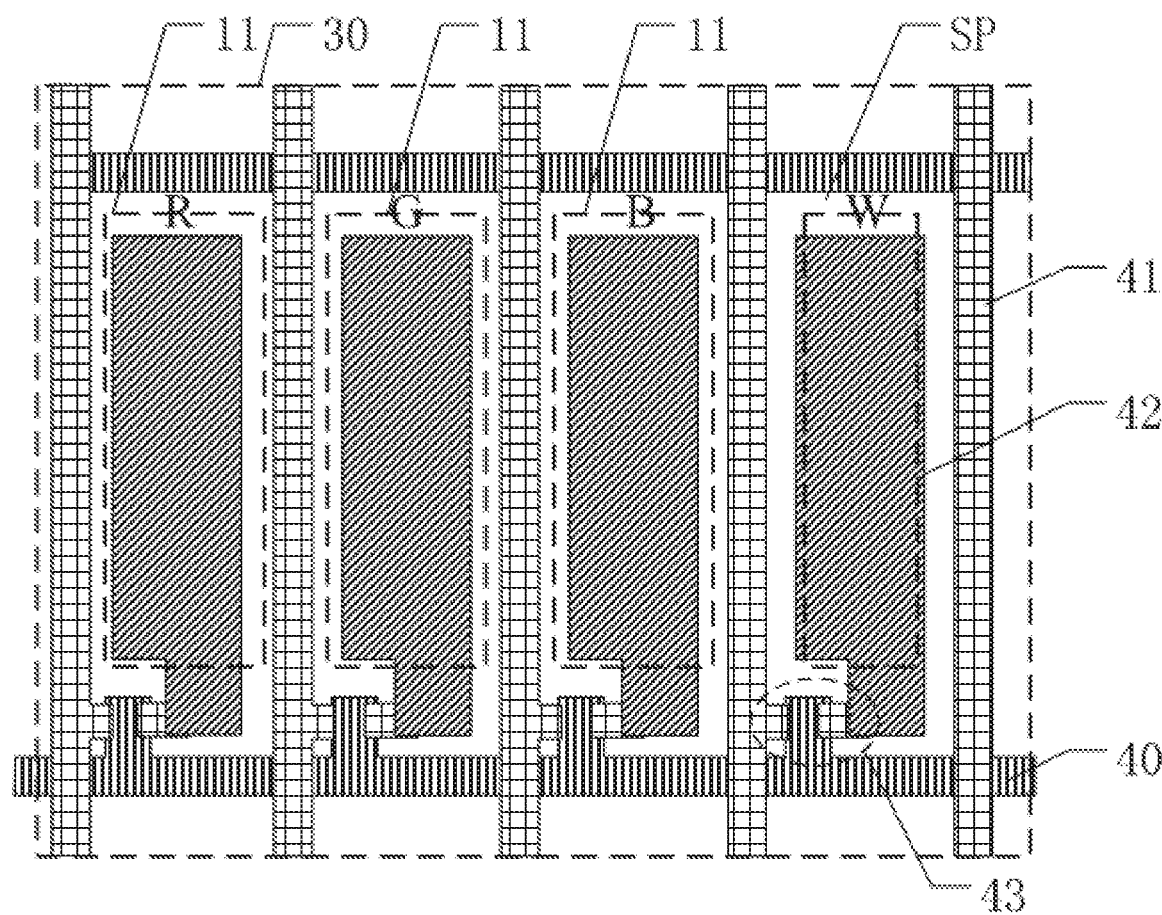
FIG. 6 illustrates a schematic view of an exemplary pixel in another exemplary display panel according to the disclosed embodiments.

FIG. 5 illustrates a schematic view of an exemplary pixel in an exemplary display panel according to the disclosed embodiments. FIG. 6 illustrates a schematic view of an exemplary pixel in another exemplary display panel according to the disclosed embodiments. A light-transmitting area of a pixel will be described in detail. As shown in FIG. 5, the display panel may further include a black matrix 30. A pixel P may include a plurality of light-transmitting areas 11. The light-transmitting area 11 may not overlap with the black matrix 30. In one embodiment, the pixel P may include a plurality of sub-pixels SP. In one embodiment, as shown in FIG. 5, the pixel P may include three sub-pixels SP of three different colors, for example, a red sub-pixel R, a green sub-pixel G, and a blue sub-pixel B, arranged in the first direction x. As shown in FIG. 6, the pixel P may include four sub-pixels SP of four different colors, for example, a red sub-pixel R, a green sub-pixel G, a blue sub-pixel B, and a white sub-pixel W. The number and the color of the sub-pixels SP included in the pixel P may be determined according to various application scenarios, which are not limited by the present disclosure.

Gate lines 40 and data lines 41 may insulatively intersect to define the sub-pixels SP. The sub-pixel SP may include a pixel electrode 42. The display panel may further include a plurality of thin-film-transistors (TFT) 43. The TFT 43 may be electrically connected to a corresponding pixel electrode 42 to drive the pixel electrode 42. In particular, the TFT 43 may include a gate electrode, a source electrode, and a drain electrode. The gate electrode of the TFT 43 may be electrically connected to a corresponding gate line 40, the source electrode of the TFT 43 may be electrically connected to a corresponding data line 41, and the drain electrode of the TFT 43 may be electrically connected to a corresponding pixel electrode 42.

The black matrix 30 may be able to shield light. The black matrix may be configured to shield the gate line 40, the data line 41, and the TFT 43, and to suppress light reflection and light leakage in the display panel. In addition, the black matrix 30 may increase the contrast ratio of the display panel.

The light-transmitting area 11 may be disposed in an area where a sub-pixel SP is located. The plurality of light-transmitting areas 11 may be one-to-one corresponding to the plurality of sub-pixels SP. In one embodiment, as shown in FIG. 5, the pixel P may include three light-transmitting areas 11 having an identical shape and occupying an identical area. As shown in FIG. 6, the pixel P may include four light-transmitting areas 11 having an identical shape but occupying different areas. The light-transmitting areas of the red sub-pixel R, the green sub-pixel G, and the blue sub-pixel B in the same pixel P may have an identical size. The light-transmitting area 11 of the white sub-pixel W may be smaller than the light-transmitting area 11 of the red sub-pixel R.

In the disclosed embodiments, one pixel P may include at least one light-transmitting area 11. The light-transmitting area 11 in each of the plurality of pixels may have an identical shape or different shapes and occupy an identical area or different areas. For illustrative purposes, the black matrix 30 in FIG. 5 and FIG. 6 is not filled with patterns, and is only denoted by a dashed-line frame. In the pixel P, the area which is not shielded by the black matrix 30 may be the light-transmitting area 11. Light may transmit through the light-transmitting areas 11. In particular, the light-transmitting area 11 may be an area where the pixel electrode 42 is mainly located.

Referring to FIG. 3 and FIG. 4, the display region AA may include at least one irregular edge S. An extension direction of the irregular edge S may intersect the first direction x and the second direction y. In one embodiment, as shown in FIG. 3, the irregular edge S may be a curved line, which is for illustrative purpose and is not intended to limit the scope of the present discourse. The extension direction of the irregular edge S may intersect both the first direction x and the second direction y. In other words, the irregular edge S may neither extend in the first direction x nor the second direction y. When the display panel displays images, a smooth curved line may be desired at the irregular edge S in the display region AA. However, as shown in FIG. 4, the actual image edge S' may appear jagged at the irregular edge of the display region AA.

Figure 3A:
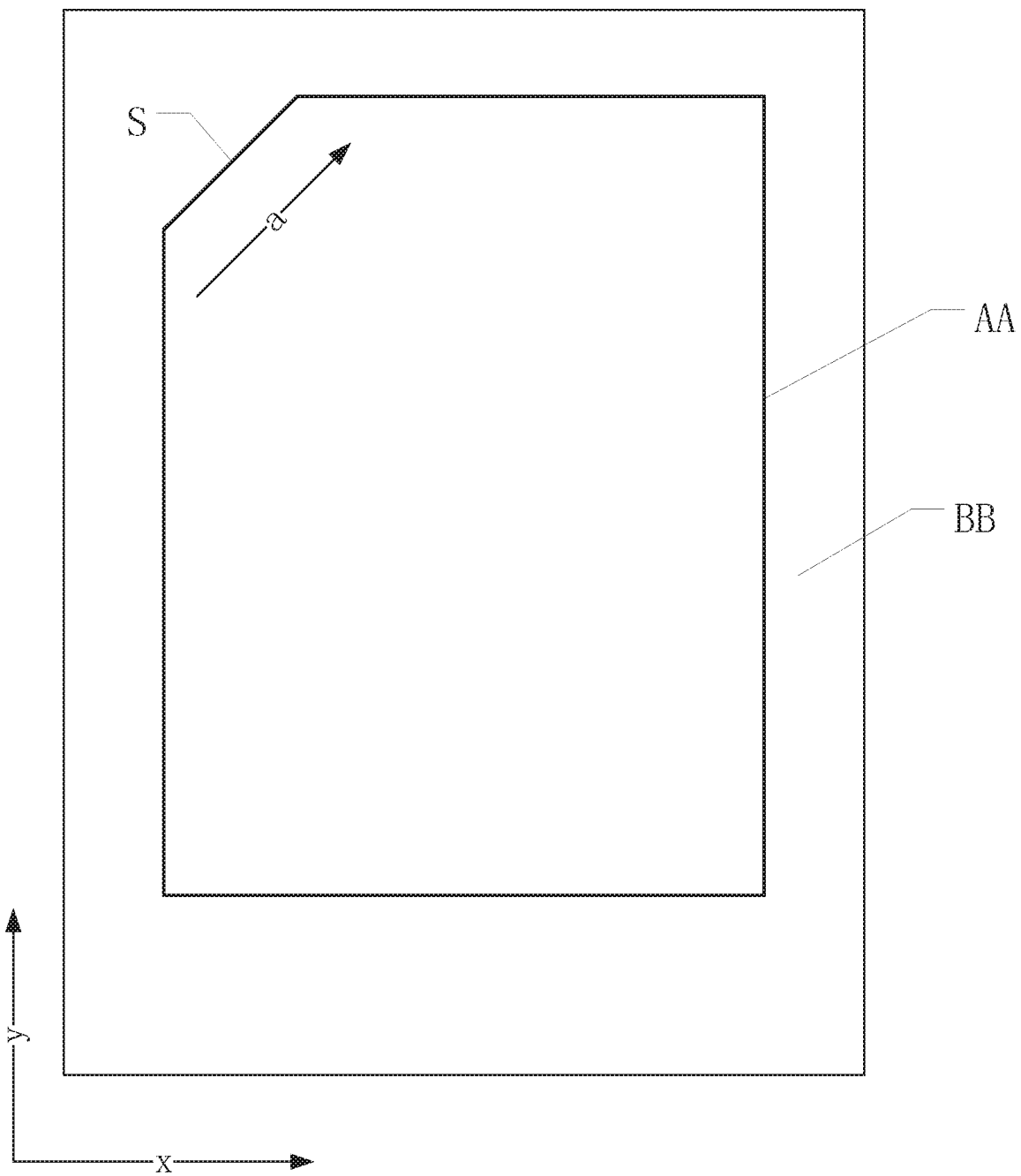
FIG. 3A illustrates a top view of another exemplary display panel according to the disclosed embodiments.

It should be noted that, in the display panel according to the disclosed embodiments, the irregular edge of the display region AA may refer to the irregular edge S which is a smooth curved line, rather than the jagged image edge S'. In the disclosed embodiments, the irregular edge S may be a curved line or a slope line. In one embodiment, as shown in FIG. 3, the irregular edge S may be a curved line. In another embodiment, as shown in FIG. 3A, the irregular edge S may be a slope line, and the extension direction of the slope line may intersect the first direction x and the second direction y.

Referring to FIG. 3 and FIG. 4, the plurality of the pixels P may include a plurality of first pixels 10 arranged adjacent to the irregular edge S and a plurality of second pixels 20 not arranged adjacent to the irregular edge S. An area occupied by the light-transmitting area 11 in the first pixel 10 may be smaller than an area occupied by the light-transmitting area 11 in the second pixel 20. It should be noted that when comparing the light-transmitting areas of two pixels, the light-transmitting areas of the same color sub-pixels of the two pixels may be compared. For example, the light-transmitting area 11 of the first pixel 10 is smaller than the light-transmitting area 11 of the second pixel 20. With respect to the pixels in FIG. 5, the light-transmitting area 11 of the red sub-pixel R in the first pixel 10 is smaller than the light-transmitting area 11 of the red sub-pixel R in the second pixel 20, the light-transmitting area 11 of the green sub-pixel G in the first pixel 10 is smaller than the light-transmitting area 11 of the green sub-pixel G in the second pixel 20, and the light-transmitting area 11 of the blue sub-pixel B in the first pixel 10 is smaller than the light-transmitting area 11 of the blue sub-pixel B in the second pixel 20. With respect to the pixels in FIG. 6, the light-transmitting area 11 of the red sub-pixel R in the first pixel 10 is smaller than the light-transmitting area 11 of the red sub-pixel R in the second pixel 20, the light-transmitting area 11 of the green sub-pixel G in the first pixel 10 is smaller than the light-transmitting area 11 of the green sub-pixel Gin the second pixel 20, the light-transmitting area 11 of the blue sub-pixel B in the first pixel 10 is smaller than the light-transmitting area 11 of the blue sub-pixel B in the second pixel 20, and the light-transmitting area 11 of the white sub-pixel W in the first pixel 10 is smaller than the light-transmitting area 11 of the white sub-pixel W in the second pixel 20.

The first pixel 10 is arranged adjacent to the irregular edge S may refer to that the first pixel 10 may have at least one edge which is not arranged adjacent to any other pixels P, and the at least one edge may form a part of the irregular edge S. In the plurality of the pixels P in the display panel, only a small number of the pixels P may be the first pixels 10, while the remained majority of the pixels P may be the second pixels 20.

Referring to FIG. 3, FIG. 4, FIG. 5, and FIG. 6, the plurality of the pixels P may include a plurality of pixel groups 100. A pixel group 100 may include at least two pixels P consecutively arranged in a same pixel row Px or in a same pixel column Py. In particular, the pixel group 100, which includes at least two pixels P consecutively arranged in the same pixel row Px or in the same pixel column Py may include one second pixel 20 and at least one first pixel 10 consecutively arranged.

When the pixel group 100 includes one second pixel 20 and a plurality of first pixel 10 consecutively arranged in the same pixel row Px or in the same pixel column Py, the light-transmitting area 11 in the first pixel 10 close to the second pixel 20 may have an area size greater than or equal to the light-transmitting area 11 in the first pixel 10 far away from the second pixel 20. In other words, in the same pixel group 100, when the first pixel 10 is further away from the second pixel 20, the area occupied by the light-transmitting area 11 in the first pixel 10 may become smaller. That is, in the same pixel group 100, the area occupied by the light-transmitting area 11 of the first pixel 10 may gradually decrease as the first pixel 10 gradually move away from the second pixel 20. When the area occupied by the light-transmitting area 11 of the first pixel 10 becomes smaller, the first pixel 10 may be less likely recognized by human eyes. In the direction moving away from the second pixel 20, the visual pattern of the first pixels 10 perceived by human eyes may gradually fade away. Thus, compared to the existing display panel, the jagged image edge at the irregular edge S of the display panel may gradually weaken.

When the pixel group 100 includes one second pixel 20 and one first pixel 10 consecutively arranged in the same pixel row Px or in the same pixel column Py, the light-transmitting area 11 in the first pixel 20 may have an area size greater than or equal to the light-transmitting area 11 in the first pixel 10. In other words, in the same pixel group 100, the area occupied by the light-transmitting area 11 in the first pixel 10 may be smaller. When the area occupied by the light-transmitting area 11 of the first pixel 10 is smaller, the first pixel 10 may be less likely recognized by human eyes. In the direction moving away from the second pixel 20, the visual pattern of the first pixel 10 perceived by human eyes may gradually fade away. Thus, compared to the existing display panel, the jagged image edge at the irregular edge S of the display panel may gradually weaken.

Returning to FIG. 3, FIG. 4, FIG. 5, and FIG. 6, the pixel group 100 may further include a first-type pixel group 101 and a second-type pixel group 102. The number of the first pixels 10 in the first-type pixel group 101 may be greater than the number of the first pixels 10 in the second-type pixel group 102. The areas occupied by the at least two pixels P in the first-type pixel group 101 may have m number of different values, i.e., the areas occupied by the light-transmitting area of the same color sub-pixels of the at least two pixels P in the first-type pixel group 101 may have m number of different values, and the areas occupied by the at least two pixels P in the second-type pixel group 102 may have n number of different values, i.e., the areas occupied by the light-transmitting area of the same color sub-pixels of the at least two pixels P in the second-type pixel group 102 may have n number of different values, where m≥n.

For example, the first-type pixel group 101 may include three pixels P: two first pixels 10 and one second pixel 20. The second-type pixel group 102 may include two pixels P: one first pixel 10 and one second pixel 20. That is, the first-type pixel group 101 may have more first pixels 10 than the second-type pixel group 102. In one embodiment, the areas occupied by the light-transmitting areas 11 of the same color sub-pixels of the three pixels P in the first-type pixel group 101 may be configured to have two different values, then m=2. The areas occupied by the light-transmitting areas 11 of the same color sub-pixels of the two pixels P in the second-type pixel group 102 may be configured to have two different values, then n=2. That is, m=n. In another embodiment, the areas occupied by the light-transmitting areas 11 of the same color sub-pixels of the three pixels P in the first-type pixel group 101 may be configured to have three different values, then, m=3. The areas occupied by the light-transmitting areas 11 of the same color sub-pixels of the two pixels P in the second-type pixel group 102 may be configured to have two different values, then n=2. That is, m>n.

Figure 5A:
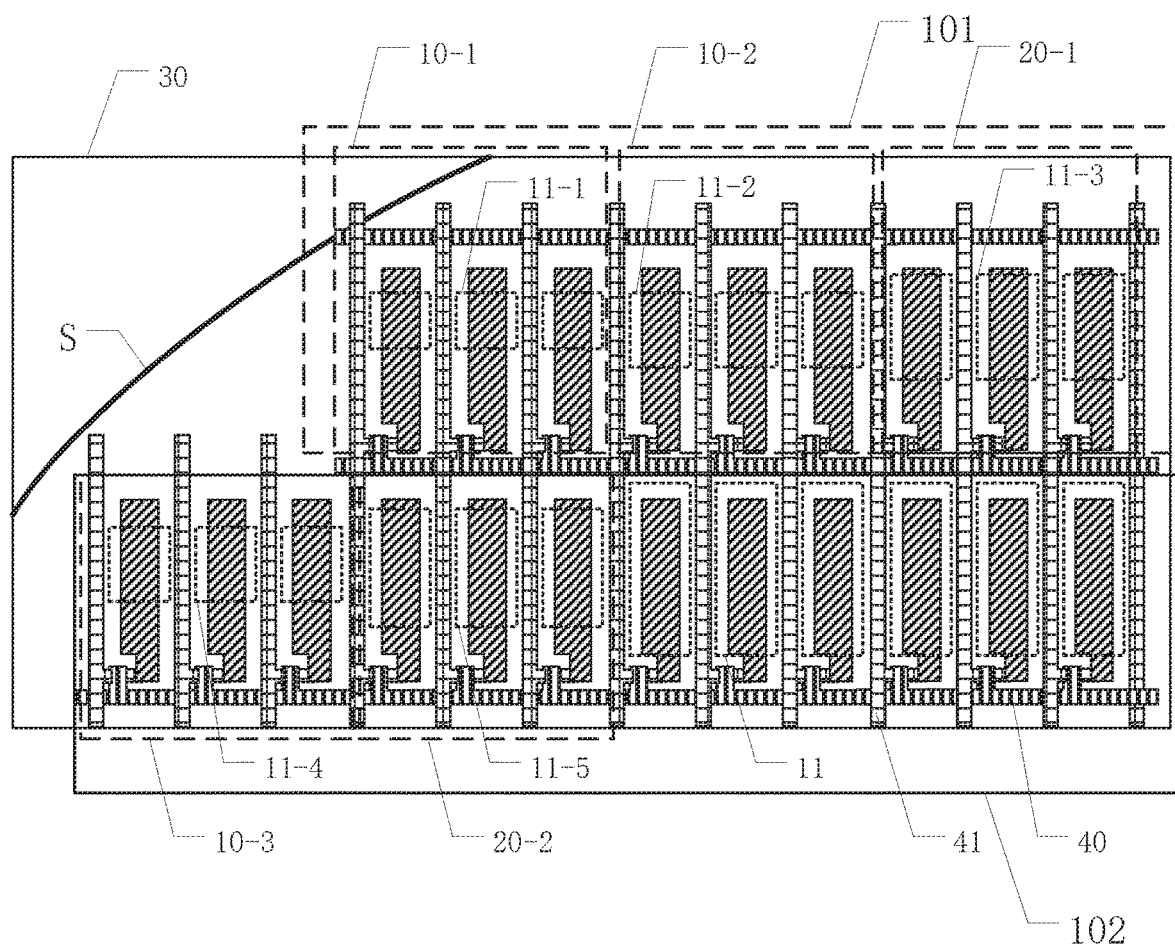
FIG. 5A illustrates a partially enlarged view of an O region in FIG. 4.

FIG. 5A illustrates a partially enlarged view of an O region in FIG. 4. FIG. 5A further illustrate the structure of the first-type pixel group 101 and the second-type pixel group 102. In one embodiment, as shown in FIG. 5A, the light-transmitting areas 11 of the three pixels P in the first-type pixel group 101 may have three different sizes, and the light-transmitting areas 11 of the two pixels P in the second-type pixel group 102 may have two different sizes. In particular, the first-type pixel group 101 may include three pixels, a first pixel 10-1, a first pixel 10-2, and a second pixel 20-1. The second-type pixel group 102 may include two pixels, a first pixel 10-3 and a second pixel 20-2. As shown in FIG. 5A, each pixel may include three sub-pixels, i.e., a red sub-pixel R, a green sub-pixel G, and a blue sub-pixel B, respectively.

In the first-type pixel group 101, the first pixel 10-1 may include a light-transmitting area 11-1, the first pixel 10-2 may include a light-transmitting area 11-2, and the second pixel 20-1 may include a light-transmitting area 11-3. The light-transmitting area 11-1 may have a smaller area than the light-transmitting area 11-2. The light-transmitting area 11-2 may have a smaller area than the light-transmitting area 11-3. The light-transmitting areas of the three pixels in the first-type pixel group 101 may have three different sizes, i.e., three different area values.

In the second-type pixel group 102, the first pixel 10-3 may include a light-transmitting area 11-4, and the second pixel 20-2 may include a light-transmitting area 11-5. The light-transmitting area 11-4 may have a smaller area than the light-transmitting area 11-5. The light-transmitting areas of the two pixels in the second-type pixel group 102 may have two different sizes.

As shown in FIG. 5A, to clearly illustrate the display panel according to the disclosed embodiment, the black matrix 30 is not filled with any patterns, but is only denoted by a dashed-line frame.

Figure 6A:
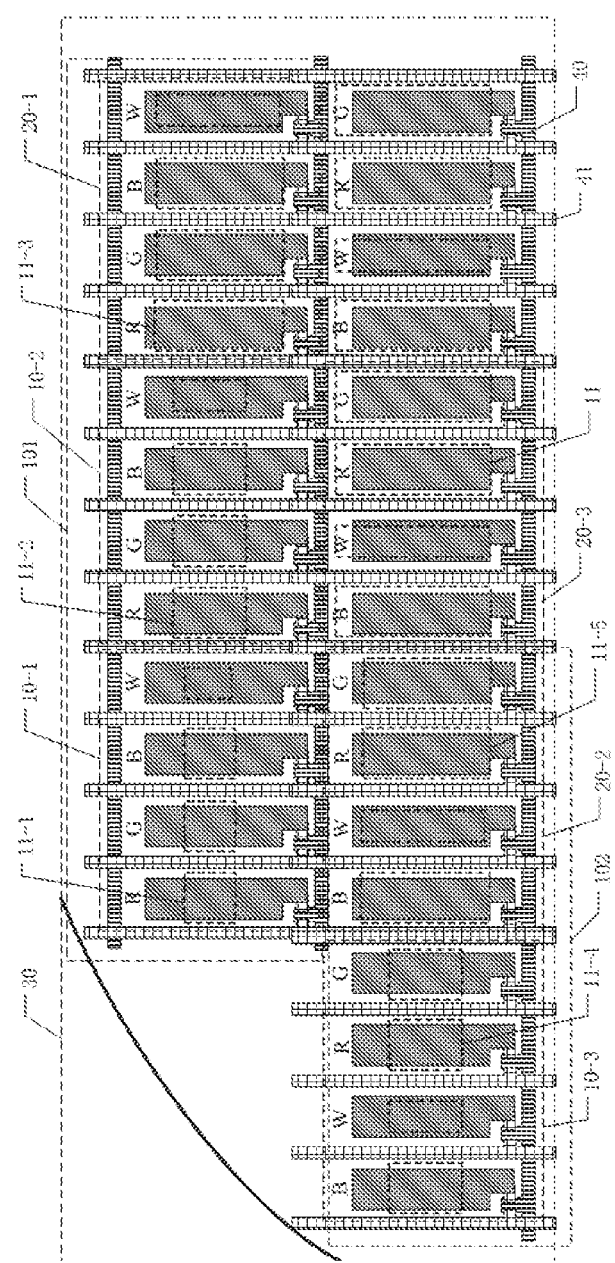
FIG. 6A illustrates another exemplary partially enlarged view of an O region in FIG. 4.

FIG. 6A illustrates another exemplary partially enlarged view of an O region in FIG. 4. FIG. 6A reuses the labels in FIG. 6. FIG. 6a illustrates in detail the structures of the first-type pixel group 101 and the second-type pixel group 102. In one embodiment, as shown in FIG. 6A, the areas occupied by the light-transmitting areas 11 of the three pixels P in the first-type pixel group 101 may have three different values, and the areas occupied by the light-transmitting areas 11 of the two pixels P in the second-type pixel group 102 may have two different values. As shown in FIG. 6A, the first-type pixel group 101 may include three pixels, i.e., the first pixel 10-1, the first pixel 10-2, the second pixel 20-1. The second-type pixel group 102 may include two pixels, i.e., the first pixel 10-3 and the second pixel 20-2. As shown in FIG. 6A, the pixel may include four sub-pixels. Referring to FIG. 4, the pixel row Px may include a first-type pixel row Px1 (e.g., the pixel row in the first-type pixel group 101) and a second-type pixel row Px 2 (e.g., the pixel row in the second-type pixel group 102), alternately arranged in the second direction y. The pixel in the first-type pixel rwo Px1 may include a red sub-pixel R, a green sub-pixel G, a blue sub-pixel B, and a white sub-pixel W, sequentially arranged in the first direction x. The pixel in the second-type pixel row Px2 may include a blue sub-pixel B, a white sub-pixel W, a red sub-pixel R, and a green sub-pixel G, sequenmtially arranged in the first direction x.

In the first-type pixel group 101, the first pixel 10-1 may include a light-transmitting area 11-1, the first pixel 10-2 may include a light-transmitting area 11-2, and the second pixel 20-1 may include a light-transmitting area 11-3. The light-transmitting area 11-1 may be smaller than the light-transmitting area 11-2. The light-transmitting area 11-2 may be smaller than the light-transmitting area 11-3. The three light-transmitting areas of the three pixels in the first-type pixel group 101 may have three different values.

In the second-type pixel group 102, the first pixel 10-3 may include a light-transmitting area 11-4, and the second pixel 20-2 may include a light-transmitting area 11-5. The light-transmitting area 11-4 may be smaller than the light-transmitting area 11-5. The two light-transmitting areas of the two pixels in the second-type pixel group 102 may have two different values.

It should be noted that, to clearly illustrate the display panel according to the disclosed embodiment, the black matrix 30 in FIG. 6A is not filled with patterns, and is only denoted by a dashed-line frame.

When the light-transmitting areas 11 of the at least two pixels P in the first-type pixel group 101 are configured to have more different sizes, the light-transmitting areas 11 of the at least two pixels P in the first-type pixel group 101 may have more levels of area change, i.e., may be more smoothly changed. In the disclosed display panel, the pixel group 100 may include a substantially large number of first pixels 10. Accordingly, the display panel may have substantially more levels of area change in the light-transmitting areas 11 of the pixels P, thereby further weakening the jagged image edge at the irregular edge S.

In the disclosed embodiments, the display region of the display panel may include at least one irregular edge. The display region may include a plurality of pixels. The plurality of the pixels may include a plurality of pixel groups. In a pixel group, the area of the light-transmitting area of a first pixel close to the second pixel may be larger than or equal to the area of the light-transmitting area of a first pixel far away from the second pixel. The first pixels may be adjacent to the irregular edge. The second pixels may not be adjacent to the irregular edge. Through gradually decreasing the areas of the light-transmitting areas of the first pixels in the pixel group, the jagged image edge may be suppressed.

In addition, the pixel group may include a first-type pixel group and a second-type pixel group. The first-type pixel group may have more first pixels than the second pixel group. In particular, the light-transmitting areas of the pixels in the first-type pixel group may be configured to have m number of different sizes. The light-transmitting areas of the pixels in the second pixel group may be configured to have n number of different sizes, where m≥n. Thus, the light-transmitting areas of the pixels in the first-type pixel group may have more layers of area changes, and the jagged image edge at the irregular edge may be further suppressed.

In certain embodiments, referring to FIG. 3, FIG. 4, FIG. 5, and FIG. 6, when the light-transmitting area 11 of the pixel P has a larger size/area, the equivalent grayscale of the pixel P may be higher. The grayscale may represent different brightness levels from the darkest to the brightest. According to the physiological characteristics of human eyes, the higher the grayscale of the pixel, the easier it is to be recognized by human eyes.

Because the sub-pixels SP are defined by the insulatively intersecting gate lines 40 and data lines 41, when the sub-pixels have the same size and the light-transmitting areas 11 have the same brightness, the larger the size of the light-transmitting area 11, the brighter the human eyes visually perceive the corresponding pixel P, i.e., the higher the equivalent grayscale of the pixel P. The equivalent grayscale of the pixel P may not be the actual grayscale of the sub-pixels in the pixel P, but may be the grayscale visually perceived by the human eyes and may be substantially affected by the size of the light-transmitting area 11.

In the disclosed embodiments, in the same pixel group 100 of the display panel, the sizes of the light-transmitting areas 11 of the first pixels 10 may gradually decrease along the direction moving away from the second pixel 20. Thus, the equivalent grayscale of the first pixels 10 may gradually decrease. The first pixels 10 having lower equivalent grayscales may be more difficult to be recognized by the human eyes. Compared to the existing display panel, the jagged image edge at the irregular edge may fade away.

Figure 7:
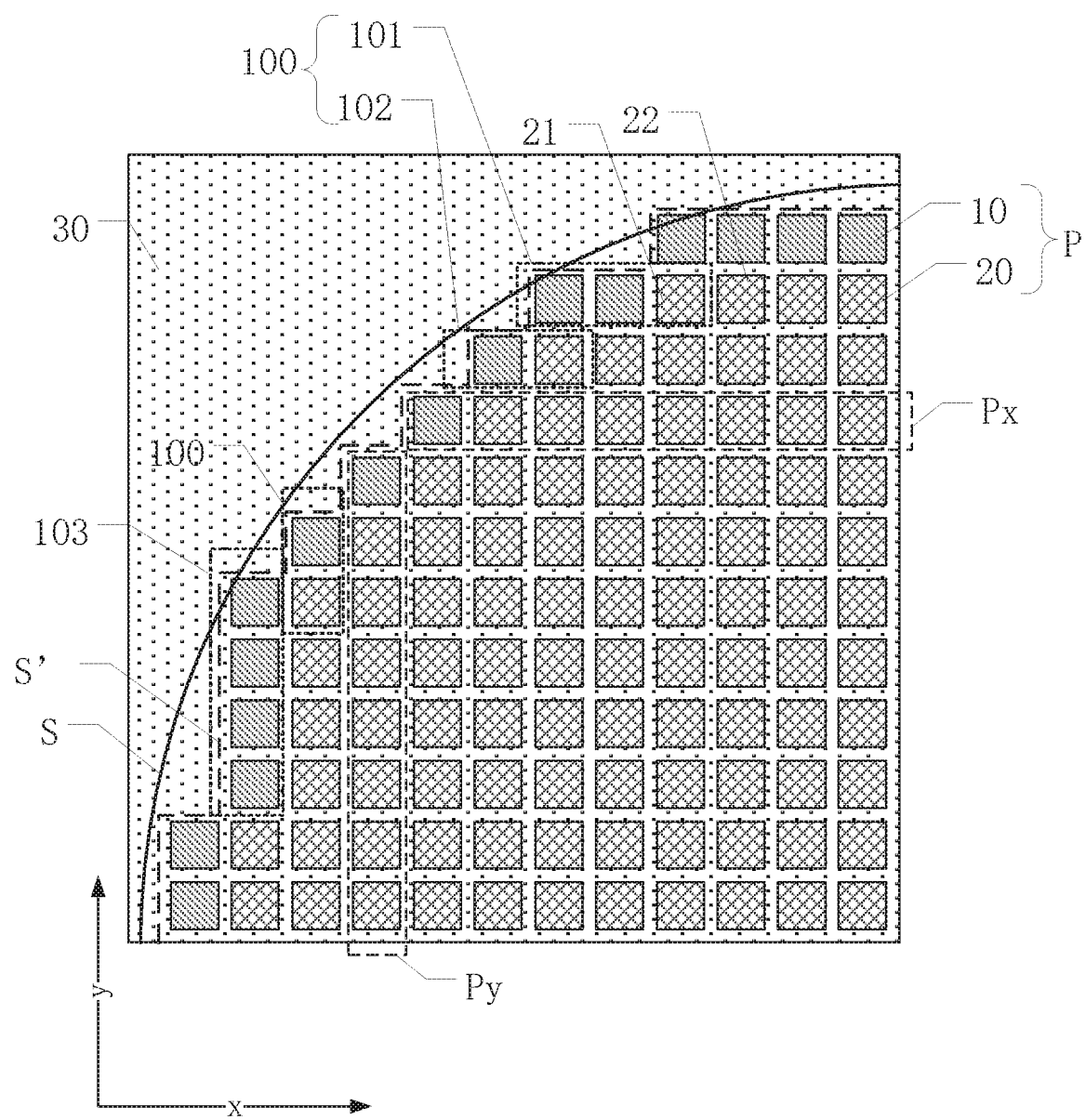
FIG. 7 illustrates another exemplary partially enlarged view of an N region in FIG. 3.

FIG. 7 illustrates another exemplary partially enlarged view of an N region in FIG. 3. FIG. 7 reuses the labels in FIG. 4. In certain embodiments, referring to FIG. 3, FIG. 5, FIG. 6, and FIG. 7, the plurality of the second pixels 20 in the display panel may include a plurality of first-type second pixels 21 and a plurality of second-type second pixels 22. The second pixels 20 in the pixel group 100 may be the first-type second pixels 21. As shown in FIG. 5A and FIG. 6A, the second pixel 20-1 in the first-type pixel group 101 may be a first-type second pixel, the second pixel 20-2 in the second-type pixel group 102 may be a first-type second pixel, and the second pixel 20-3 in the second-type pixel group 102 may be a second-type second pixel. The light-transmitting areas 11 of the second-type second pixels 22 may have a size A while the light-transmitting areas 11 of the first-type second pixels 21 may have a size smaller than or equal to A. In the disclosed embodiments, only a small number of the pixels P may be the first-type second pixels 21. The remained majority of the pixels P may be the second-type second pixels 22.

In one embodiment, the light-transmitting areas 11 of the second-type second pixels 22 may have the same size A. That is, the light-transmitting areas 11 of the most pixels P in the display panel may have a same size, such that the display panel may have a uniform display performance. In a same pixel group 100, the light-transmitting area 11 of any first pixel 10 may have a size smaller than the size of the light-transmitting area 11 of any second pixel 20. The light-transmitting area 11 of a first pixel 10 close to the first-type second pixel 21 may have a size larger than or equal to the size of the light-transmitting area 11 of a first pixel 10 further away from the first-type second pixel 21. Thus, the light-transmitting area 11 of the first-type second pixel 21 may have the largest size in the pixel group 100.

In one embodiment, the light-transmitting area 11 of the first-type second pixel 21 may be configured to have a size smaller than or equal to the size of the light-transmitting area 11 of the second-type second pixel 22, such that the equivalent grayscale of the first type second pixel 21 may be smaller than or equal to the grayscale of the second-type second pixel 22. Compared to the plurality of the second-type second pixels 22, the pixel group 100 may be disposed adjacent to the irregular edge S. The equivalent grayscale of the first-type second pixel 21 may be configured to be smaller than or equal to that of the second-type second pixel 22, such that the equivalent grayscale of the pixels P may gradually decrease in a direction toward the irregular edge S, and the first-type second pixel 21 may be unlikely recognized by human eyes. Thus, in the direction toward the irregular edge S, the images displayed by the display panel may have a smooth and natural transition in the grayscale levels, thereby enhancing the display performance.

In certain embodiments, referring to FIG. 5A, FIG. 6A, and FIG. 7, the pixel P may include at least three sub-pixels SP arranged in the first direction x. The light-transmitting area of a first-type sub-pixel in the second-type second pixel 20-3 may be a standard light-transmitting area having a rectangular shape. A first-type sub-pixel may be any of the at least three sub-pixels. For example, the first-type sub-pixel may be the green sub-pixel G. The standard light-transmitting area may have a size A. The pixels having a size of the light-transmitting area smaller than A may include the first pixel 10-1, the first pixel 10-2, the first pixel 10-3, the second pixel 20-1, and the second pixel 20-2. The light-transmitting area of a first-type sub-pixel (e.g., a green sub-pixel G) in the first pixels and the first-type second pixels may be a non-standard light-transmitting area.

The non-standard light-transmitting area may have two different shapes, i.e., a rectangular shape and a square shape. When the non-standard light-transmitting area has a rectangular shape, a length of the non-standard light-transmitting area in the first direction x is equal to a length of the standard light-transmitting area in the first direction x, and a length of the non-standard light-transmitting area in the second direction y is smaller than a length of the standard light-transmitting area in the second direction y. When the non-standard light-transmitting area has a square shape, the length of the non-standard light-transmitting area in the first direction is smaller than the length of the standard light-transmitting area in the first direction, and the length of the non-standard light-transmitting area in the second direction is smaller than the length of the standard light-transmitting area in the second direction.

In the disclosed display panel, when the smooth transition effect of the equivalent grayscales is achieved by adjusting sizes of the light-transmitting areas, the desired adjustment method may be keeping the lengths of the light-transmitting areas in the first direction constant while reducing the lengths of the light-transmitting areas in the second direction. When the length in the first direction is equal to the length in the second direction, i.e., the light-transmitting area has a square shape, the lengths in both the first direction and the second direction may be simultaneously reduced.

In certain embodiments, referring to FIG. 3, FIG. 5, FIG. 6, FIG. 7, with respect to the light-transmitting area of a certain color sub-pixel in the display panel, the equivalent grayscale of the second-type second pixel 22 may be configured to be 255. The equivalent grayscale of a pixel P may be represented by Gx. Then, the size of the light-transmitting area 11 of the pixel P may be $Sx=A*(Gx/255)^{2.2}$, where the pixel P is a pixel other than a second-type second pixel 22. In particular, for the convenience of calculating the size Sx of the light-transmitting area 11 of the pixel P, Gamma 2.2 transmittance ratio when the equivalent grayscale Gx is 255 may be defined to be a baseline reference at 100%. When the equivalent grayscale of the pixel P is Gx, the corresponding Gamma 2.2 transmittance ratio Tx may be defined to be:

$$Tx=(Gx/255)^{2.2}*100\% \quad (1)$$

The transmittance ratio Tx of the pixel P is linearly correlated to the size Sx of the light-transmitting area 11 of the pixel P. Then, the size Sx of the light-transmitting area 11 may be calculated to be:

$$Sx=(A*Tx)/100\% \quad (2)$$

$Sx=A*(Gx/255)^{2.2}$ may be obtained by plugging equation (1) into equation (2).

In the disclosed display panel, the equivalent grayscale Gx of any pixel P other than a second-type second pixel 22 may be configured. For example, according to the actual images displayed by the display panel, the equivalent grayscales Gx of all the pixels P in the pixel group 100 may be configured. Then, the equation $Sx=A*(Gx/255)^{2.2}$ may be used to calculate the sizes Sx of the light-transmitting areas 11 of the pixels P. When forming the black matrix 30 of the display panel, the mask parameters may be adjusted accordingly to obtain the light-transmitting areas 11 of different sizes Sx.

In one embodiment, referring to FIG. 3, FIG. 5, FIG. 6, and FIG. 7, the pixel group 100 may include at least two pixels P, where the equivalent grayscale difference between the at least two pixels P is an integer multiple of 16. In other embodiments, the pixel group 100 may include at least two pixels P, where the equivalent grayscale difference between the at least two pixels P is an integer multiple of 14, 15, 17, or 18.

In certain embodiments, either the pixel row Px or the pixel column Py of a pixel group may include M number of consecutively arranged first pixels, where M is an integer and M≥2. The pixel group may include M number of the consecutively arranged first pixels. Referring to FIG. 7, for example, the pixel column Py of the pixel group 103 may include four consecutively arranged first pixels 10. All four consecutively arranged first pixels 10 may be disposed in the pixel group 103. In one embodiment, the M number of the consecutively arranged first pixels 10 in either a pixel row Px or a pixel column Py may be configured in a same pixel group 100, such that, in the direction toward the irregular edge S, the visual perception by human eyes of the M number of the consecutively arranged first pixels 10 may gradually weaken. Thus, compared to the existing display panel, the jagged image edge at the irregular edge S may be suppressed.

Figure 8:
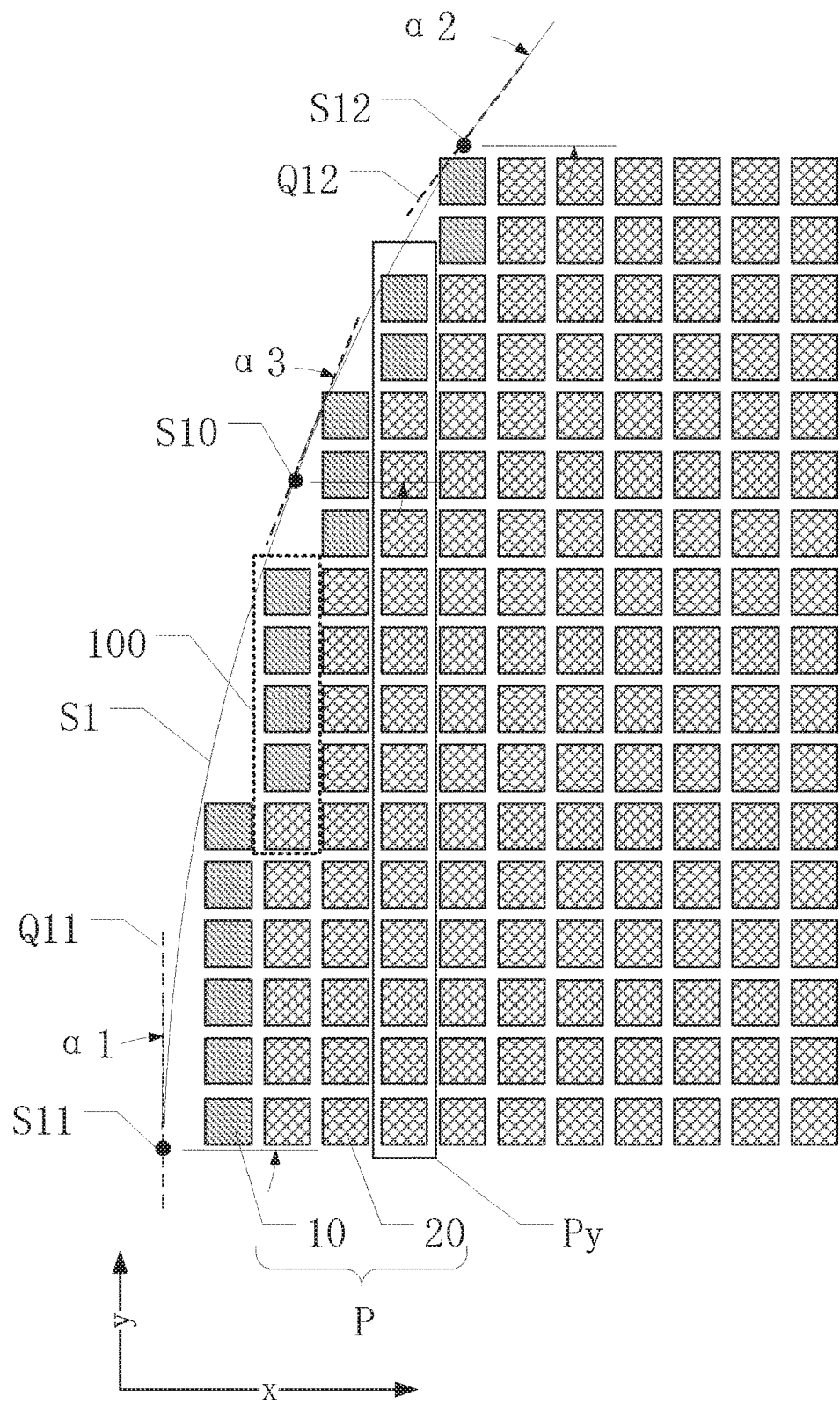
FIG. 8 illustrates a partial top view of an exemplary display panel according to the disclosed embodiments.

FIG. 8 illustrates a partial top view of an exemplary display panel according to the disclosed embodiments. In certain embodiments, referring to FIG. 5, FIG. 6, and FIG. 8, the irregular edge S may be a curved line. The curved line may include a first curved line section S1. The curved line section S1 may include a first curved line end point S11, a first curved line end point S12, and a first curved line point S10. The first curved line point S10 may be any point on the first curved line section S1 which is neither the first curved line end point S11 or the first curved line end point S12.

An angle between a tangent line Q11 passing through the first curved line end point S11 and the first direction x may be represented by α1. An angle between a tangent line Q12 passing through the first curved line end point S12 and the first direction x may be represented by α2. An angle between a tangent line Q10 passing through the first curved line point S10 and the first direction x may be represented by α3. In one embodiment, $77.5°<α1≤90°$, $77.5°-α2<90°$, and $α2<α3<α1$. In the pixel group 100 including the first pixels 10 adjacent to the first curved line section S1, at least two pixels P may be disposed in a same pixel column Py.

In one embodiment, referring to FIG. 8, because the angles between the tangent lines passing through various points on the first curved line section S1 and the first direction x are substantially large and approximately in the range between 77.5° and 90°, the first curved line section S1 may be considered as "steep". Consequently, the pixel group 100 adjacent to the first curved line section S1 may include a substantially large number of the first pixels 10. In particular, the pixel group 100 adjacent to the first curved line section S1 may include at least two first pixels 10.

In the disclosed embodiments, because the angles between the tangent lines passing through various points on the first line section S1 and the first direction x are substantially large, the first curved line section S1 may tend to extend approximately in the second direction y. Thus, at least two pixels P in the pixel group 100 may be configured in a same pixel column Py, such that the light-transmitting areas 11 of the first pixels 10 may gradually decrease in size along the second direction y when approaching the first curved line section S1. Compared to the existing display panel, the jagged image edge at the first curved line section S1 may be suppressed.

Figure 9:
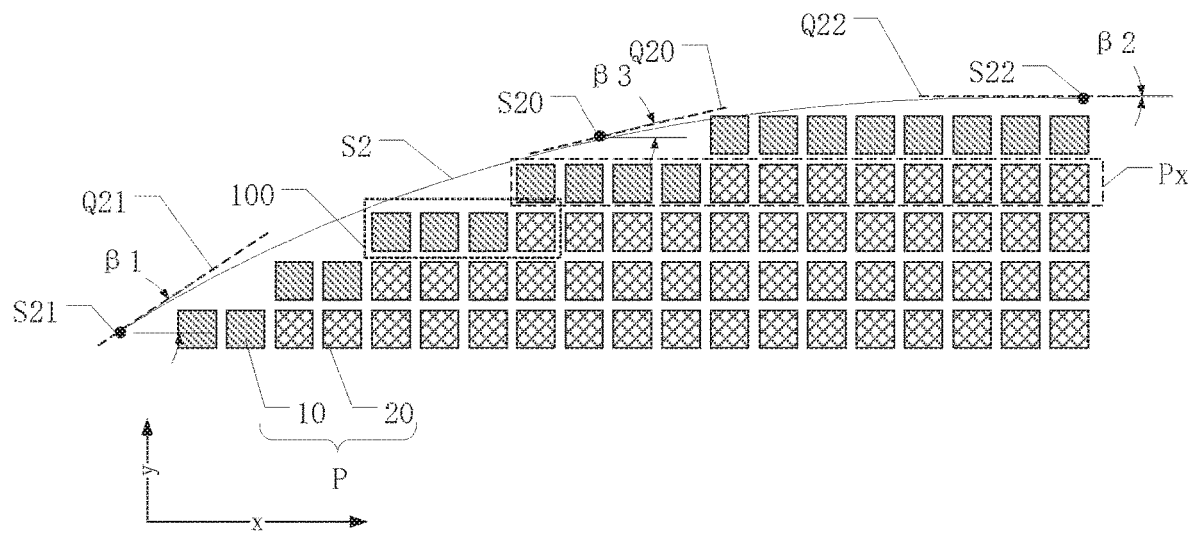
FIG. 9 illustrates a partial top view of another exemplary display panel according to the disclosed embodiments.

FIG. 9 illustrates a partial top view of another exemplary display panel according to the disclosed embodiments. FIG. 9 reuses the labels in FIG. 4. In certain embodiments, referring to FIG. 5, FIG. 6, and FIG. 9, the irregular edge may be a curved line. The curved line may include a second curved line section S2. The second curved line section S2 may include a second curved line end point S21, a second curved line end point S22, and a second curved line point S20. The second curved line point S20 may be any point on the second curved line section S2, which is neither the second curved line end point S21 nor the second curved line end point S22.

An angle between a tangent line Q21 passing through the second curved line end point S21 and the first direction x may be represented by β1. An angle between a tangent line Q22 passing through the second curved line end point S22 and the first direction x may be represented by β2. An angle between a tangent line Q20 passing through the second curved line point S20 and the first direction x may be represented by β3. In one embodiment, $0°<β1≤22.5°$, $0°≤β2<22.5°$, and $β2<β3<β1$. In the pixel group 100 including the first pixels 10 adjacent to the second curved line section S2, at least two pixels P may be disposed in a same pixel row Px.

In one embodiment, referring to FIG. 9, because the angles between the tangent lines passing through various points on the second curved line section S2 and the first direction x are substantially small and approximately in the range between 0° and 22.5°, the second curved line section S2 may be considered as "flat". Consequently, the pixel group 100 adjacent to the second curved line section S2 may include a substantially large number of the first pixels 10. In particular, the pixel group 100 adjacent to the second curved line section S2 may include at least two first pixels 10.

In the disclosed embodiments, because the angles between the tangent lines passing through various points on the second line section S2 and the first direction x are substantially small, the second curved line section S2 may tend to extend approximately in the first direction x. Thus, at least two pixels P in the pixel group 100 may be configured in a same pixel row Px, such that the light-transmitting areas 11 of the first pixels 10 may gradually decrease in size along the first direction x when approaching the second curved line section S2. Compared to the existing display panel, the jagged image edge at the second curved line section S2 may be suppressed.

Figure 10:
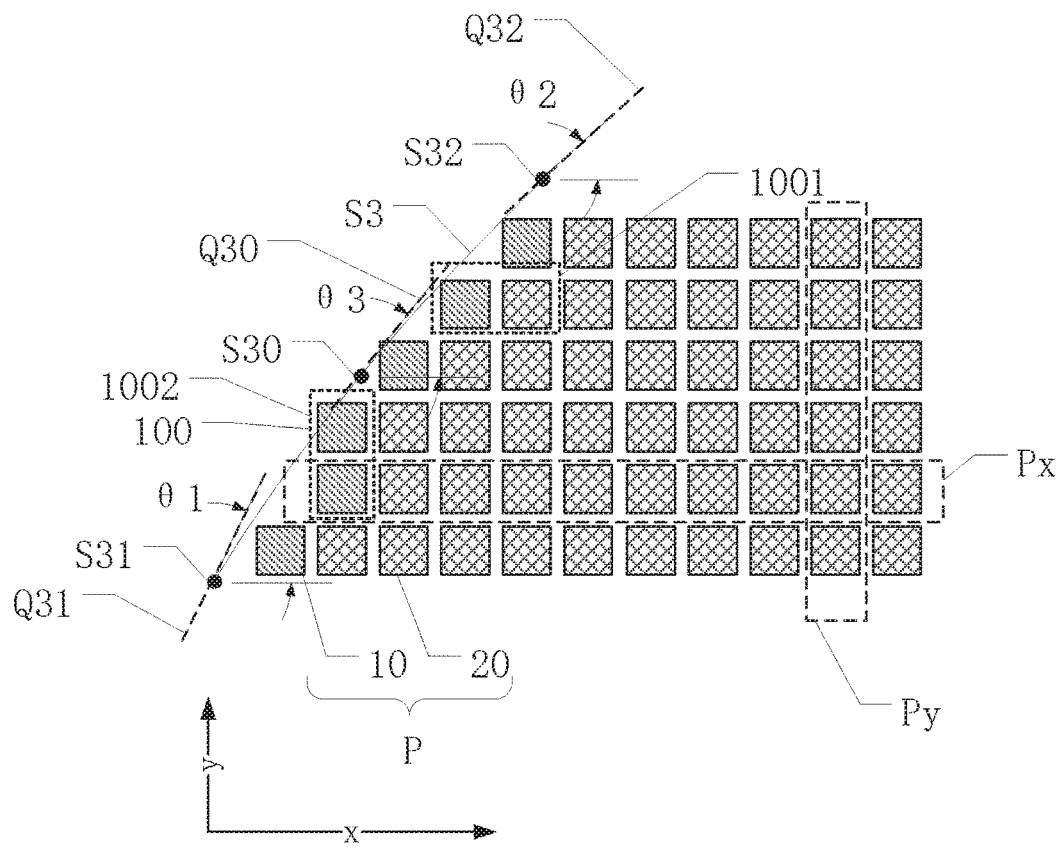
FIG. 10 illustrates a partial top view of another exemplary display panel according to the disclosed embodiments.

FIG. 10 illustrates a partial top view of another exemplary display panel according to the disclosed embodiments. FIG. 10 reuses the labels in FIG. 4. In certain embodiments, referring to FIG. 5, FIG. 6, and FIG. 10, the irregular edge may be a curved line. The curved line may include a third curved line section S3. The third curved line section S3 may include a third curved line end point S31, a third curved line end point S32, and a third curved line point S30. The third curved line point S30 may be any point on the third curved line section S3, which is neither the third curved line end point S31 nor the third curved line end point S32.

An angle between a tangent line Q31 passing through the third curved line end point S31 and the first direction x may be represented by θ1. An angle between a tangent line Q32 passing through the third curved line end point S32 and the first direction x may be represented by θ2. An angle between a tangent line Q30 passing through the third curved line point S30 and the first direction x may be represented by θ3. In one embodiment, $45°<θ1≤77.5°$, $45°≤θ2<77.5°$, and $θ2<θ3<θ1$. In the pixel group 100 including the first pixels 10 adjacent to the third curved line section S3, at least two pixels P may be disposed in a same pixel row Px or a same pixel column Py.

In particular, for example, as shown in FIG. 9, the pixel group 1001 may include at least two pixels P in a same pixel row Px, and the pixel group 1002 may include at least two pixels P in a same pixel column Py. In one embodiment, the angles between the tangent lines passing through various points on the third curved line section S3 and the first direction x may be approximately in the range between 45° and 77.5°. The third curved line section S3 may extend in a direction approximately between the first direction x and the second direction y. The third curved line section S3 may be considered to be neither "steep" nor "flat". In one embodiment, the pixel group 100 may include at least two pixels P in a same pixel row Px. In another embodiment, the pixel group 100 may include at least two pixels P in a same pixel column Py. The light-transmitting areas 11 of the first pixels 10 may gradually decrease in size along either the first direction x or the second direction y when approaching the third curved line section S3. Compared to the existing display panel, the jagged image edge at the third curved line section S3 may be suppressed.

Figure 11:
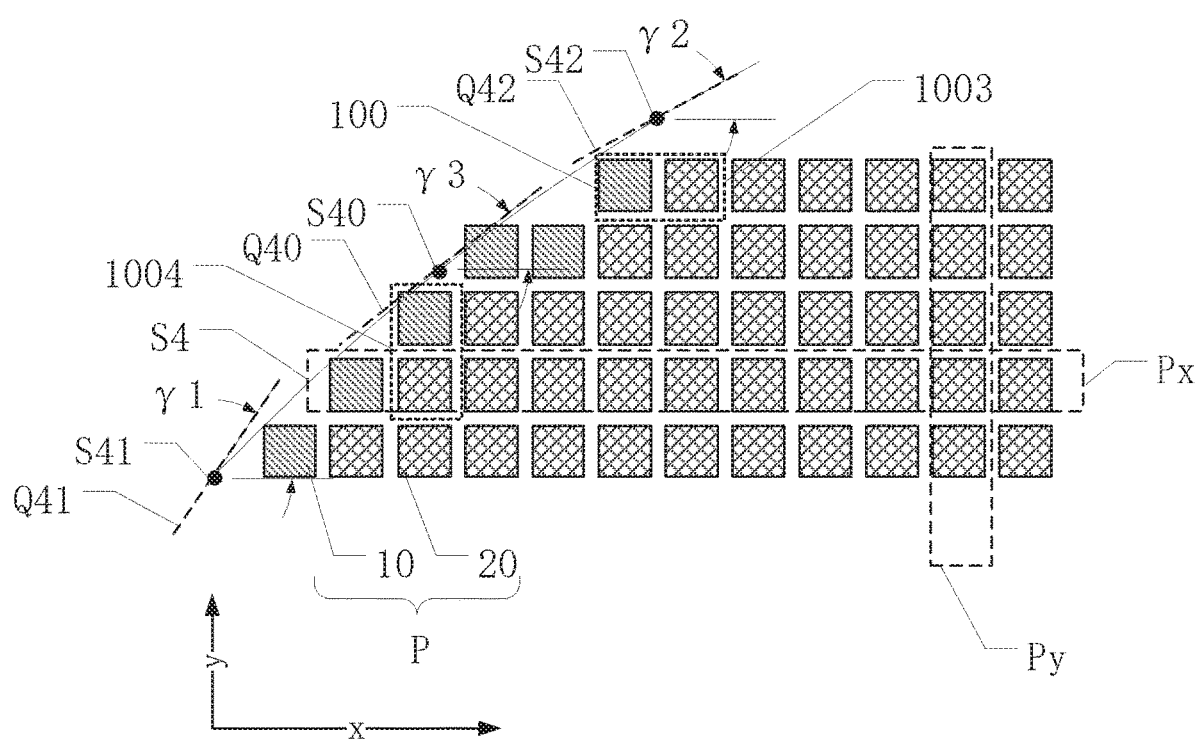
FIG. 11 illustrates a partial top view of another exemplary display panel according to the disclosed embodiments.

FIG. 11 illustrates a partial top view of another exemplary display panel according to the disclosed embodiments. FIG. 11 reuses the labels in FIG. 4. In certain embodiments, referring to FIG. 5, FIG. 6, and FIG. 11, the irregular edge may be a curved line. The curved line may include a fourth curved line section S4. The fourth curved line section S4 may include a fourth curved line end point S41, a fourth curved line end point S42, and a fourth curved line point S40. The fourth curved line point S40 may be any point on the fourth curved line section S4, which is neither the fourth curved line end point S41 nor the fourth curved line end point S42.

An angle between a tangent line Q41 passing through the fourth curved line end point S41 and the first direction x may be represented by γ1. An angle between a tangent line Q42 passing through the fourth curved line end point S42 and the first direction x may be represented by γ2. An angle between a tangent line Q40 passing through the fourth curved line point S40 and the first direction x may be represented by γ3. In one embodiment, 22.5°<γ1≤45°, 22.5°≤γ2<45°, and γ2<γ3<γ1. In the pixel group 100 including the first pixels 10 adjacent to the fourth curved line section S4, at least two pixels P may be disposed in a same pixel row Px or a same pixel column Py.

In particular, for example, as shown in FIG. 11, the pixel group 1003 may include at least two pixels P in a same pixel row Px, and the pixel group 1004 may include at least two pixels P in a same pixel column Py. In one embodiment, the angles between the tangent lines passing through various points on the fourth curved line section S4 and the first direction x may be approximately in the range between 22.5° and 45°. The fourth curved line section S4 may extend in a direction approximately between the first direction x and the second direction y. The fourth curved line section S4 may be considered to be neither "flat" nor "steep". In one embodiment, the pixel group 100 may include at least two pixels P in a same pixel row Px. In another embodiment, the pixel group 100 may include at least two pixels P in a same pixel column Py. The light-transmitting areas 11 of the first pixels 10 may gradually decrease in size along either the first direction x or the second direction y when approaching the fourth curved line section S4. Compared to the existing display panel, the jagged image edge at the fourth curved line section S4 may be suppressed.

Figure 12:
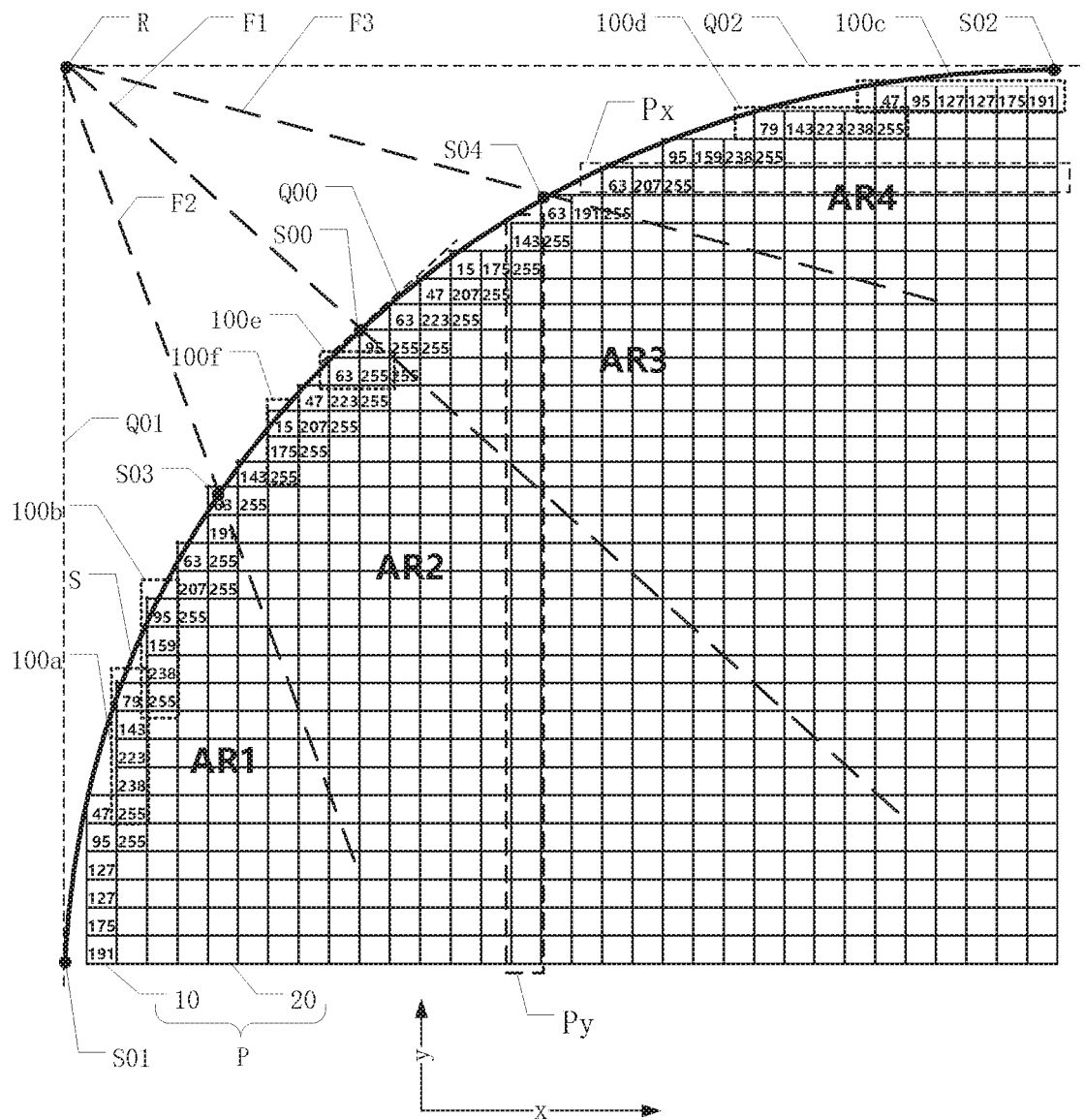
FIG. 12 illustrates a partial top view of another exemplary display panel according to the disclosed embodiments.

FIG. 12 illustrates a partial top view of another exemplary display panel according to the disclosed embodiments. For illustrative purposes, pixels P may be represented by grids. In certain embodiments, referring to FIG. 5, FIG. 6, and FIG. 12, the irregular edge may be a circular arc. The circular arc may include a first end point S01, a second end point S02, and a first middle point S00. A tangent line passing through the first end point S01 may be a first tangent line Q01. A tangent line passing through the second end point S02 may be a second tangent line Q02. A tangent line Q00 passing through the first middle point S00 may form an angle of approximately 45° with respect to the first direction x. The first tangent line Q01 may be perpendicular to the second tangent line Q02, and may intersect the second tangent line Q02 at a first vertex R.

The circular arc may further include a first point S03 disposed between the first end point S01 and the first middle point S00, and a second point S04 disposed between the second end point S02 and the first middle point S00. A line between the first vertex R and the first middle point S00 may be a first straight line F1. A line between the first vertex R and the first point S03 may be a second straight line F2. A line between the first vertex R and the second point S04 may be a third straight line F3. A display region between the first tangent line Q01 and the second straight F2 may be a first region AR1. A display region between the second straight line F2 and the first straight line F1 may be a second region AR2. A display region between the first straight line F1 and the third straight line F3 may be a third region AR3. A display region between the third straight line F3 and the second tangent line Q02 may be a fourth region AR4.

The first region AR1 may include a plurality of pixel groups 100. A pixel group 100 may include at least two pixels P in a same pixel column Py. In two adjacent pixel groups 100 in the first region AR1, one may be closer to the first tangent line Q01 and may be denoted as the pixel group 100a, and the other may be denoted as the pixel group 100b. The pixel group 100a may have more first pixels 10 than the pixel group 100b. The pixel group 100a may include five pixels P having five different levels of equivalent grayscale. The pixel group 100b may include four pixels P having four different levels of equivalent grayscale. When the light-transmitting area 11 of a pixel P is larger, the equivalent grayscale level of the pixel P may be higher. That is, the light-transmitting areas 11 of the five pixels P in the pixel group 100a may have five different sizes, and the light-transmitting areas 11 of the four pixels P in the pixel group 100b may have four different sizes.

In certain embodiments, referring to FIG. 5, FIG. 6, and FIG. 12, the fourth region AR4 may include a plurality of pixel groups 100. A pixel group 100 may include at least two pixels P in a same pixel row Px. In two adjacent pixel groups 100 in the fourth region AR4, one may be closer to the second tangent line Q02 and may be denoted as the pixel group 100c, and the other may be denoted as the pixel group 100d. The pixel group 100c may have more first pixels 10 than the pixel group 100d. The pixel group 100c may include six pixels P having six different levels of equivalent grayscale, and the pixel group 100d may include five pixels P having five different levels of equivalent grayscale. When the light-transmitting area 11 of a pixel P is larger, the equivalent grayscale level of the pixel P may be higher. That is, the light-transmitting areas 11 of the six pixels P in the pixel group 100c may have six different sizes, and the light-transmitting areas 11 of the five pixels P in the pixel group 100d may have five different sizes.

In one embodiment, the pixels P disposed in the first region AR1 and the pixels P disposed in the fourth region AR4 may be symmetrically arranged with respect to the first straight line F1 as an axis of symmetry. Any two symmetrically arranged pixels P may have a same equivalent grayscale. When two symmetrically arranged pixels P have identical equivalent grayscales in the disclosed display panel, and the pixels P disposed in the first region AR1 and the pixels P disposed in the fourth region AR4 are symmetrically arranged with respect to the first straight line F1, the images displayed on the display panel may look nicer.

In one embodiment, referring to FIG. 5, FIG. 6, and FIG. 12, in the second region AR2, a pixel group 100 may include at least two pixels P disposed in a same pixel row or a same pixel column. In particular, for example, the pixel group 100e may include two pixels P disposed in the same pixel row Px, and the pixel group 100f may include three pixels P disposed in the same pixel column Py. Similarly, in another embodiment, in the third region AR3, a pixel group 100 may include at least two pixels P disposed in a same pixel row Px or in a same pixel column Py, which is determined according to practical application scenario and is not limited by the present disclosure.

In one embodiment, the pixels P disposed in the second region AR2 and the pixels P disposed in the third region AR3 may be symmetrically arranged with respect to the first straight line F1 as an axis of symmetry. Any two symmetrically arranged pixels P may have a same equivalent grayscale. When two symmetrically arranged pixels P have identical equivalent grayscale in the display panel according to the disclosed embodiment, and the pixels P disposed in the second region AR1 and the pixels P disposed in the third region AR4 are symmetrically arranged with respect to the first straight line F1, the images displayed on the display panel may look nicer.

As shown in FIG. 12, for illustrative purposes, the equivalent grayscale values for the pixels P adjacent to the irregular edge S are provided. Any pixel P without a marked equivalent grayscale value may be assumed to have the equivalent grayscale value of 255. Through calculations and experiments, the equivalent grayscale values for the pixels P shown in FIG. 12 may effectively suppress the jagged image edge at the irregular edge S.

In certain embodiments, the display panel may include one irregular edge. In certain other embodiments, the display panel may include a plurality of irregular edges. The plurality of the irregular edges may have a same shape or different shapes, which is determined according to practical application scenario and is not limited by the present disclosure.

Figure 13:
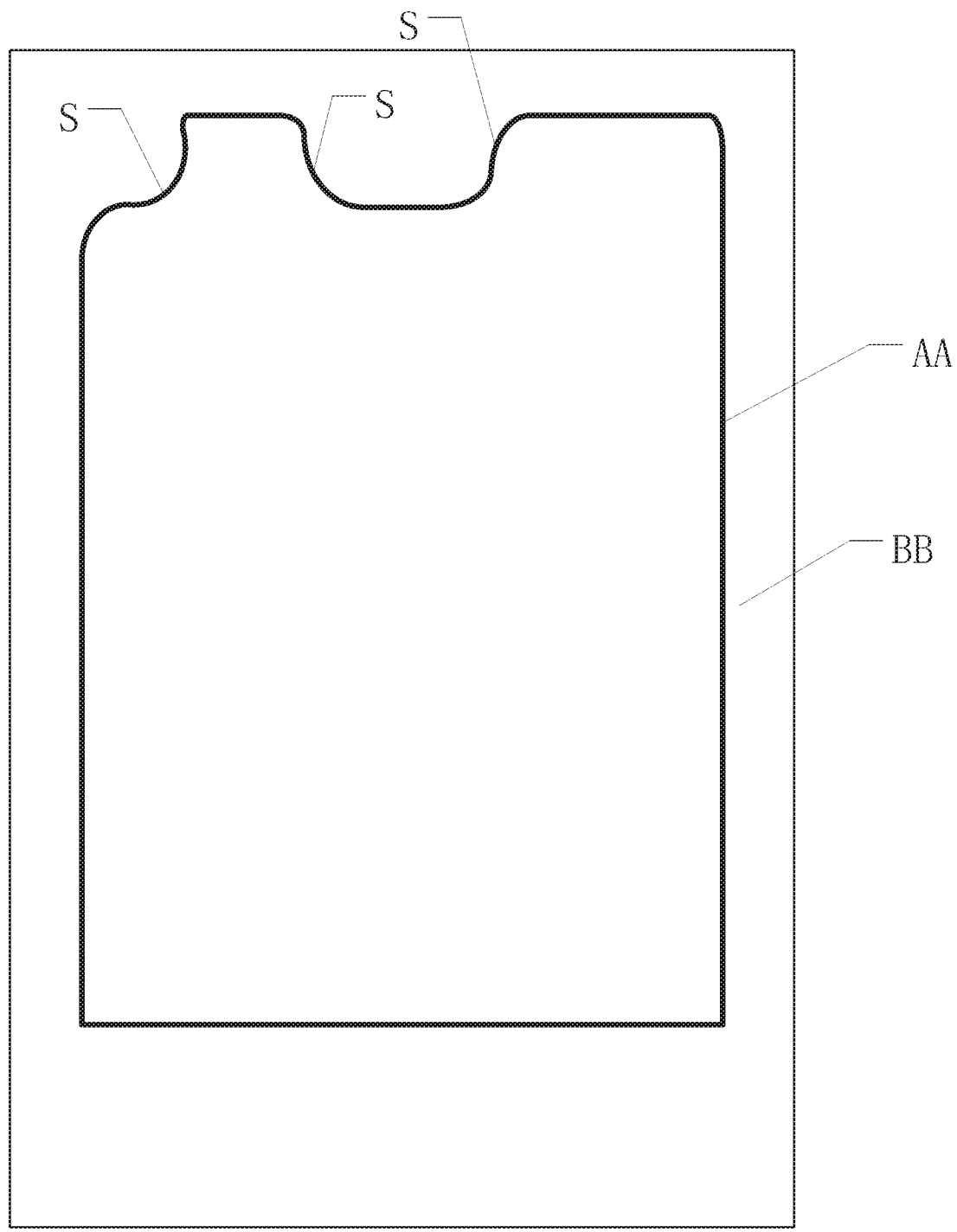
FIG. 13 illustrates a top view of another exemplary display panel according to the disclosed embodiments.

FIG. 13 illustrates a top view of another exemplary display panel according to the disclosed embodiments. In one embodiment, as shown in FIG. 13, the display panel may include a display region AA and a non-display region BB surrounding the display region AA. The display region AA may include a plurality of irregular edges S.

Figure 14:
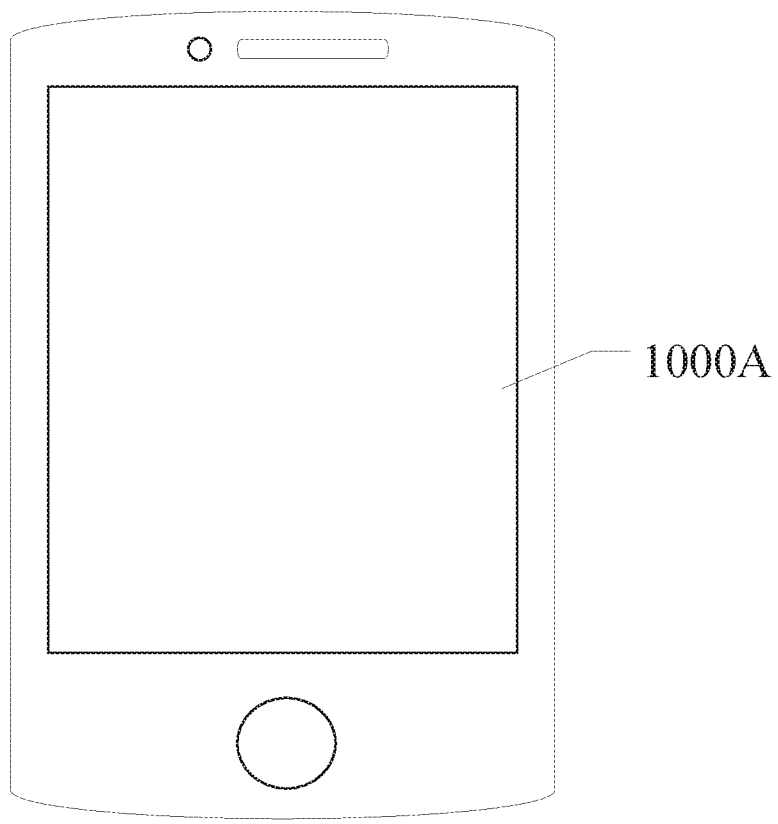
FIG. 14 illustrates a schematic view of an exemplary display apparatus according to the disclosed embodiments.

The present disclosure also provides a display apparatus, comprising a disclosed display panel. FIG. 14 illustrates a schematic view of an exemplary display apparatus according to the disclosed embodiments. As shown in FIG. 14, the display apparatus 1000 may include a display panel 1000A provided by any one of the disclosed embodiments. For illustrative purposes, only a smart phone is shown in FIG. 14. In other embodiments, the display apparatus 1000 may be a computer, a television set, a vehicle-mounted device, or other display apparatus having a display function, which is not limited by the present disclosure. The display apparatus 1000 may include the features and functions of the disclosed display panel 1000A, which may refer to the description of the display panel and will not be repeated here.

The display panel and the display apparatus according to the disclosed embodiments provide the following features and functions.

In the display panel and the display apparatus, a display region includes at least one irregular edge. The display region also includes a plurality of pixels. A pixel includes at least one sub-pixel. A sub-pixel includes a light-transmitting area. The plurality of the pixels includes a plurality of pixel groups. Pixels adjacent to the irregular edge are first pixels. Pixels not adjacent to the irregular edge are second pixels. A pixel group includes a plurality of first pixels and one second pixel. In a pixel group, the light-transmitting area of a first pixel close to the second pixel is greater than or equal to the light-transmitting area of a pixel far away from the same second pixel. Through reducing the sizes of the light-transmitting areas of the first pixels, a jagged image edge at the irregular edge may be suppressed.

In addition, the plurality of pixel groups include a plurality of first-type pixel groups and a plurality of second-type pixel groups. The first-type pixel group includes more first pixels than the second-type pixel group. The light-transmitting areas of the pixels in the first-type pixel group have m number of different sizes, and the light-transmitting areas of the pixels in the second-type pixel group have n number of different sizes, where m>n. Thus, the light-transmitting areas of the pixels in the first-type pixel group have more different sizes, and the jagged image edge at the irregular edge is further suppressed.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
a display region including a plurality of pixels arranged in both a first direction and a second direction, wherein the plurality of pixels are arranged in the first direction to form a plurality of pixel rows and, meanwhile, arranged in the second direction to form a plurality of pixel columns, and a pixel includes a light-transmitting area;
a non-display region surrounding the display region; and
a black matrix without overlapping with the light-transmitting area,
wherein:
the display region includes at least one irregular edge intersecting both the first direction and the second direction;
the plurality of pixels include a plurality of first pixels intersecting the at least one irregular edge and a plurality of second pixels without intersecting the at least one irregular edge, and the light-transmitting area of the first pixel is smaller than the light-transmitting area of the second pixel;
the plurality of pixels include a plurality of pixel groups, wherein a pixel group includes at least two pixels consecutively arranged in a same pixel row or a same pixel column,
when the at least two pixels include one second pixel and one first pixel, the light-transmitting area of the first pixel is smaller than the light-transmitting area of the second pixel, and
when the at least two pixels includes one second pixel and more than one first pixel, the light-transmitting area in the first pixel close to the second pixel is greater than or equal to the light-transmitting area in the first pixel far away from the second pixel;

the plurality of pixel groups include a plurality of first-type pixel groups and a plurality of second-type pixel groups, and a first-type pixel group includes more first pixels than a second-type pixel group; and the light-transmitting areas of a color sub-pixel in the at least two pixels in the first-type pixel group have m number of different sizes, and the light-transmitting areas of a same color sub-pixel in the at least two pixels in the second-type pixel group have n number of different sizes, where m≥n.

2. The display panel according to claim 1, wherein:
the pixel row or the pixel column included in the pixel group includes M number of first pixels consecutively arranged;
the pixel group includes M number of first pixels consecutively arranged; and
M≥2.

3. The display panel according to claim 1, wherein:
the at least one irregular edge is a curved line including a third curved line section, wherein the third curved line section includes a third curved line end point S31, a third curved line end point S32, and a third curved line point S30, and the third curved line point S30 is any point on the third curved line section other than the third curved line end point S31 and the third curved line end point S32;
an angle between a tangent line passing through the third curved line end point S31 and the first direction is θ1, an angle between a tangent line passing through the third curved line end point S32 and the first direction is θ2, and an angle between a tangent line passing through the third curved line point S30 and the first direction is θ3, wherein 45°<θ1≤77.5°, 45°≤θ2<77.5°, and θ2<θ3<θ1; and
in the pixel group in which the at least one first pixel is adjacent to the third curved line section, the at least two pixels are consecutively arranged in the same pixel column or the same pixel row.

4. The display panel according to claim 1, wherein:
the at least one irregular edge is a curved line including a fourth curved line section, wherein the fourth curved line section includes a fourth curved line end point S41, a fourth curved line end point S42, and a fourth curved line point S40, and the fourth curved line point S40 is any point on the fourth curved line section other than the fourth curved line end point S41 and the fourth curved line end point S42;
an angle between a tangent line passing through the fourth curved line end point S41 and the first direction is γ1, an angle between a tangent line passing through the fourth curved line end point S42 and the first direction is γ2, and an angle between a tangent line passing through the fourth curved line point S40 and the first direction is γ3, wherein 22.5°<γ1≤45°, 22.5°≤γ2<45°, and γ2<γ3<γ1; and
in the pixel group in which the at least one first pixel is adjacent to the fourth curved line section, the at least two pixels are consecutively arranged in the same pixel column or the same pixel row.

5. The display panel according to claim 1, wherein:
the pixel includes a red sub-pixel, a green sub-pixel, and a blue sub-pixel, sequentially arranged in the first direction.

6. The display panel according to claim 1, wherein:
when the size of the light-transmitting area of the pixel increases, an equivalent grayscale of the pixel increases.

7. The display panel according to claim 6, wherein:
in a same pixel group, an equivalent grayscale difference between at least two pixels is an integer multiple of 16.

8. The display panel according to claim 6, wherein:
the plurality of second pixels include a plurality of first-type second pixels and a plurality of second-type second pixels, and the second pixel in the pixel group is a first-type second pixel;
the size of the light-transmitting area of a second-type second pixel is A; and
the size of the light-transmitting area of the first-type second pixel is smaller than or equal to A.

9. The display panel according to claim 8, wherein:
the second-type second pixel has an equivalent grayscale of 255; and
when any pixel other than the second-type second pixel has an equivalent grayscale Gx, the size of the light-transmitting area of the any pixel is configured to be $A*(Gx/255)^{2.2}$.

10. The display panel according to claim 8, wherein:
the pixel includes at least three sub-pixels arranged in the first direction;
a first-type sub-pixel is any of the at least three sub-pixels;
a light-transmitting area of the first-type sub-pixel in the second-type second pixel is a standard light-transmitting area having a rectangular shape;
a light-transmitting area of the first-type sub-pixel in a pixel having a light-transmitting area smaller than A is a non-standard light-transmitting area;
when the non-standard light-transmitting area has a rectangular shape, a length of the non-standard light-transmitting area in the first direction is equal to a length of the standard light-transmitting area in the first direction, and a length of the non-standard light-transmitting area in the second direction is smaller than a length of the standard light-transmitting area in the second direction; and
when the non-standard light-transmitting area has a square shape, the length of the non-standard light-transmitting area in the first direction is smaller than the length of the standard light-transmitting area in the first direction, and the length of the non-standard light-transmitting area in the second direction is smaller than the length of the standard light-transmitting area in the second direction.

11. The display panel according to claim 6, wherein:
the at least one irregular edge is a circular arc, wherein the circular arc includes a first end point, a second end point, and a first middle point, a tangent line passing through the first end point is a first tangent line, a tangent line passing through the second end point is a second tangent line, an angle between a tangent line passing through the first middle point and the first direction is about 45°, and the first tangent line and the second tangent line are perpendicular to each other and intersect at a first vertex;
the circular arc further includes a first point disposed between the first end point and the first middle point, and a second point disposed between the second end point and the first middle point;

a line between the first vertex and the first middle point is a first straight line, a line between the first vertex and the first point is a second straight line, and a line between the first vertex and the second point is a third straight line;

the display region between the first tangent line and the second straight line is a first region, the display region between the second straight line and the first straight line is a second region, the display region between the first straight line and the third straight line is a third region, and the display region between the third straight line and the second tangent line is a fourth region; and the first region includes a first number of the pixel groups, the pixel group has at least two pixels disposed in the same pixel column, and any two adjacent pixel groups in the first region include one first-type pixel group disposed close to the first tangent line and one second-type pixel group disposed further away from the first tangent line.

12. The display panel according to claim 11, wherein:
the fourth region includes a second number of the pixel groups, the pixel group has at least two pixels disposed in the same pixel row, and any two adjacent pixel groups in the fourth region include one first-type pixel group disposed close to the second tangent line and one second-type pixel group disposed further away from the second tangent line.

13. The display panel according to claim 11, wherein:
in the second region, the at least two pixels in the pixel group are consecutively arranged in the same pixel row or the same pixel column.

14. The display panel according to claim 11, wherein:
in the third region, the at least two pixels in the pixel group are consecutively arranged in the same pixel row or the same pixel column.

15. The display panel according to claim 11, wherein:
the pixel in the first region and the pixel in the fourth region are symmetrically arranged with respect to the first straight line as an axis of symmetry; and
any two symmetrically arranged pixels have identical equivalent grayscales.

16. The display panel according to claim 11, wherein:
the pixel in the second region and the pixel in the third region are symmetrically arranged with respect to the first straight line as an axis of symmetry; and
any two symmetrically arranged pixels have identical equivalent grayscales.

17. The display panel according to claim 1, wherein:
the at least one irregular edge is a curved line including a first curved line section, wherein the first curved line section includes a first curved line end point S11, a first curved line end point S12, and a first curved line point S10, and the first curved line point S10 is any point on the first curved line section other than the first curved line end point S11 and the first curved line end point S12;
an angle between a tangent line passing through the first curved line end point S11 and the first direction is α1, an angle between a tangent line passing through the first curved line end point S12 and the first direction is α2, and an angle between a tangent line passing through the first curved line point S10 and the first direction is α3, wherein 77.5°<α1≤90°, 77.5°≤α2<90°, and α2<α3<α1; and in the pixel group in which the at least one first pixel is adjacent to the first curved line section, the at least two pixels are consecutively arranged in the same pixel column.

18. The display panel according to claim 17, wherein:
the pixel group adjacent to the first curved line section includes at least two first pixels.

19. The display panel according to claim 1, wherein:
the at least one irregular edge is a curved line including a second curved line section, wherein the second curved line section includes a second curved line end point S21, a second curved line end point S22, and a second curved line point S20, and the second curved line point S20 is any point on the second curved line section other than the second curved line end point S21 and the second curved line end point S22;
an angle between a tangent line passing through the second curved line end point S21 and the first direction is β1, an angle between a tangent line passing through the second curved line end point S22 and the first direction is β2, and an angle between a tangent line passing through the second curved line point S20 and the first direction is β, wherein 0°<β1≤22.5°, 0°≤β2<22.5°, and β2<β3<β1; and
in the pixel group in which the at least one first pixel is adjacent to the second curved line section, the at least two pixels are consecutively arranged in the same pixel row.

20. The display panel according to claim 19, wherein:
the pixel group adjacent to the second curved line section includes at least two first pixels.

21. The display panel according to claim 1, wherein:
the pixel includes a red sub-pixel, a green sub-pixel, a blue sub-pixel, and a white sub-pixel.

22. The display panel according to claim 21, wherein:
the red sub-pixel, the green sub-pixel, and the blue sub-pixel in a same pixel have a same light-transmitting area; and
a light-transmitting area of the white sub-pixel in the same pixel is smaller than the light-transmitting area of the red sub-pixel.

23. The display panel according to claim 21, wherein:
the red sub-pixel, the green sub-pixel, the blue sub-pixel, and the white sub-pixel in a same pixel are arranged in the first direction.

24. The display panel according to claim 23, wherein:
the plurality of pixel rows include a plurality of first-type pixel rows and a plurality of second-type pixel rows, alternately arranged in the second direction;
a pixel in the first-type pixel row includes the red sub-pixel, the green sub-pixel, the blue sub-pixel, and the white sub-pixel, sequentially arranged in the first direction; and
a pixel in the second-type pixel row includes the blue sub-pixel, the white sub-pixel, the red sub-pixel, and the green sub-pixel, sequentially arranged in the first direction.

25. A display apparatus, comprising a display panel including:
a display region including a plurality of pixels arranged in both a first direction and a second direction, wherein the plurality of pixels are arranged in the first direction to form a plurality of pixel rows and, meanwhile, arranged in the second direction to form a plurality of pixel columns, and a pixel includes a light-transmitting area;

a non-display region surrounding the display region; and a black matrix without overlapping with the light-transmitting area, wherein:

the display region includes at least one irregular edge intersecting both the first direction and the second direction;

the plurality of pixels include a plurality of first pixels intersecting the at least one irregular edge and a plurality of second pixels without intersecting the at least one irregular edge, and the light-transmitting area of the first pixel is smaller than the light-transmitting area of the second pixel;

the plurality of pixels include a plurality of pixel groups, wherein a pixel group includes at least two pixels consecutively arranged in a same pixel row or a same pixel column, when the at least two pixels include one second pixel and one first pixel, the light-transmitting area of the first pixel is smaller than the light-transmitting area of the second pixel, and when the at least two pixels includes one second pixel and more than one first pixel, the light-transmitting area in the first pixel close to the second pixel is greater than or equal to the light-transmitting area in the first pixel far away from the second pixel;

the plurality of pixel groups include a plurality of first-type pixel groups and a plurality of second-type pixel groups, and a first-type pixel group includes more first pixels than a second-type pixel group; and the light-transmitting areas of the at least two pixels in the first-type pixel group have m number of different sizes, and the light-transmitting areas of the at least two pixels in the second-type pixel group have n number of different sizes, where m≥n.

* * * * *